United States Patent
Mizutani

(10) Patent No.: US 8,092,977 B2
(45) Date of Patent: Jan. 10, 2012

(54) POSITIVE RESIST COMPOSITION AND PATTERN FORMING METHOD USING THE SAME

(75) Inventor: Kazuyoshi Mizutani, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 834 days.

(21) Appl. No.: 12/043,356

(22) Filed: Mar. 6, 2008

(65) Prior Publication Data
US 2008/0220370 A1    Sep. 11, 2008

(30) Foreign Application Priority Data

Mar. 6, 2007 (JP) ................................. 2007-055378
Feb. 15, 2008 (JP) ................................. 2008-035026

(51) Int. Cl.
*G03F 7/039* (2006.01)
*G03F 7/028* (2006.01)
*C08F 12/26* (2006.01)
*C08F 12/30* (2006.01)

(52) U.S. Cl. ..................... 430/270.1; 430/326; 526/286; 526/287; 526/288; 526/310

(58) Field of Classification Search ............... 430/270.1, 430/326; 526/242, 243, 248, 251, 287, 288, 526/286, 310
See application file for complete search history.

(56) References Cited

U.S. PATENT DOCUMENTS 5,561,194 A    10/1996  Cornett et al.
6,416,928 B1 *  7/2002  Ohsawa et al. ............ 430/270.1

FOREIGN PATENT DOCUMENTS

| JP | 05-019477 A | 1/1993 |
| JP | 6-67433 A | 3/1994 |
| JP | 2001-166474 A | 6/2001 |
| JP | 2001-166478 A | 6/2001 |
| JP | 2001-194792 A | 7/2001 |
| JP | 2003-107708 A | 4/2003 |
| WO | 02/25376 A2 | 3/2002 |
| WO | 2006/013687 A1 | 2/2006 |
| WO | 2007/147782 A2 | 12/2007 |
| WO | WO 2007/148623 * | 12/2007 |

OTHER PUBLICATIONS

Machine translation of JP 05-019477, published on Jan. 29, 1993.*
Extended European Search Report dated Jul. 24, 2008.
Jerry March: "Advance Organic Chemistry", 1992, John Wiley and Sons, USA, (XP-002485759).

* cited by examiner

*Primary Examiner* — Anca Eoff
(74) *Attorney, Agent, or Firm* — Sughrue Mion, PLLC

(57) ABSTRACT

A positive resist composition, includes: (A) a resin having a repeating unit represented by formula (A) as defined in the specification, which decomposes under an action of an acid to increase a solubility of the resin (A) in an alkali developer; and a pattern forming method uses the composition.

15 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitable for use in the ultramicrolithography process such as production of VLSI or high-capacity microchip or in other photofabrication processes, and a pattern forming method using the same. More specifically, the present invention relates to a positive resist composition capable of forming a high-resolution pattern by using KrF excimer laser light, electron beam, X ray, EUV light or the like, and a pattern forming method using the same. That is, the present invention relates to a positive resist composition suitably usable for fine processing of a semiconductor device, where KrF excimer laser light, electron beam, X ray or EUV light is used, and a pattern forming method using the same.

2. Description of the Related Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

The lithography using electron beam or EUV light is positioned as a next-generation or next-next-generation pattern formation technique and a positive resist assured of high sensitivity and high resolution is being demanded. Particularly, in order to shorten the wafer processing time, the elevation of sensitivity is very important, but in the case of a positive resist for use with electron beam or EUV, when high sensitivity is sought for, not only reduction in the resolving power but also worsening of the defocus latitude depended on line pitch are incurred and development of a resist satisfying these performances at the same time is strongly demanded. The defocus latitude depended on line pitch as used herein means a difference in the pattern dimension between a high density portion and a low density portion of a resist pattern and when this difference is large, the process margin is disadvantageously narrowed at the actual pattern formation. How to reduce this difference is one of important problems to be solved in the resist technology development. The high sensitivity, high resolution and good defocus latitude depended on line pitch are in a trade-off relationship and it is very important how to satisfy these performances at the same time.

Furthermore, also in the lithography using KrF excimer laser light, how to satisfy all of high sensitivity, high resolution and good defocus latitude depended on line pitch is an important problem, and this problem needs to be solved.

As regards the resist suitable for such a lithography process using KrF excimer laser light, electron beam or EUV light, a chemical amplification-type resist utilizing an acid catalytic reaction is mainly used from the standpoint of elevating the sensitivity and in the case of a positive resist, a chemical amplification-type resist composition mainly comprising an acid generator and a phenolic polymer which is insoluble or sparingly soluble in an alkali developer but becomes soluble in an alkali developer under the action of an acid (hereinafter simply referred to as a "phenolic acid-decomposable resin"), is being effectively used.

With respect to such a positive resist, there are known some resist compositions using a phenolic acid-decomposable resin obtained by copolymerizing an acid-decomposable acrylate monomer having an alicyclic group as the acid-decomposable group. Examples thereof include positive resist compositions disclosed in U.S. Pat. No. 5,561,194, JP-A-2001-166474 (the term "JP-A" as used herein means an "unexamined published Japanese patent application"), JP-A-2001-166478, JP-A-2003-107708, JP-A-2001-194792 and JP-A-6-67433.

However, by any combination of these techniques, it is impossible at present to satisfy all performances in terms of high sensitivity, high resolution, good defocus latitude depended on line pitch, line width roughness and exposure margin in the ultrafine region.

SUMMARY OF THE INVENTION

An object of the present invention is to solve the problems in the technology for enhancing the performance at fine patterning of a semiconductor device, where actinic ray or radiation, particularly, KrF excimer laser light, electron beam, X ray or EUV light is used, and provide a positive resist composition satisfying all performances in terms of high sensitivity, high resolution, good defocus latitude depended on line pitch, line width roughness and exposure margin, and a pattern forming method using the composition.

(1) A positive resist composition, comprising:
(A) a resin having a repeating unit represented by formula (A), which decomposes under an action of an acid to increase a solubility of the resin (A) in an alkali developer:

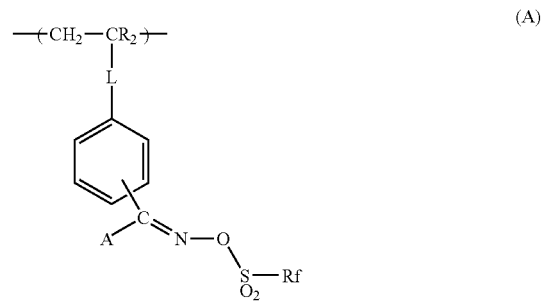

wherein $R_2$ represents a hydrogen atom, an alkyl group, a cyano group or a halogen atom;

L represents a single bond or a divalent linking group;

A represents a monovalent organic group; and

Rf represents an alkyl group, a cycloalkyl group or an aryl group.

(2) The positive resist composition as described in (1) above,
wherein in formula (A), A is an alkyl, cycloalkyl or aryl group substituted by a group selected from the group consisting of a halogen atom, a cyano group and a nitro group.

(3) The positive resist composition as described in (1) or (2) above,
wherein in formula (A), Rf is an alkyl or aryl group substituted by a halogen atom.

(4) The positive resist composition as described in any of (1) to (3) above,
wherein $R_2$ represents a hydrogen atom or a methyl group.

(5) The positive resist composition as described in any of (1) to (4) above, wherein L represents a single bond, an arylene group, an ester group or an amido group.

(6) The positive resist composition as described in any of (1) to (5) above, wherein the resin (A) further contains at least one of a repeating unit represented by formula (1) and a repeating unit represented by formula (2):

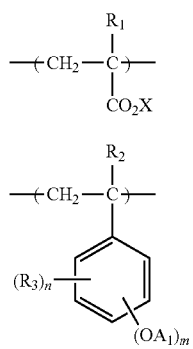

wherein in formula (1), $R_1$ represents a hydrogen atom, an alkyl group, a cyano group or a halogen atom; and X represents a group which leaves under an action of an acid, and in formula (2), $R_2$ represents a hydrogen atom, an alkyl group, a cyano group or a halogen atom;

$R_3$ represents an alkyl group, a halogen atom, an aryl group, an alkoxy group, an alkoxycarbonyl group or an acyl group, and when a plurality of $R_3$'s are present, the plurality of $R_3$'s are the same or different;

n represents an integer of 0 to 4;

$A_1$ a hydrogen atom, a group which leaves under an action of an acid or a group having a group which decomposes under an action of an acid, and when a plurality of $A_1$'s are present, the plurality of $A_1$'s are the same or different; and m represents an integer of 1 to 5, provided that $m+n \leq 5$.

(7) The positive resist composition as described in any of (1) to (6) above, which further comprises (B) a compound capable of generating an acid upon irradiation with actinic rays or radiation.

(8) A pattern forming method, comprising:

forming a resist film from the positive resist composition as described in any of (1) to (7) above; and exposing and developing the resist film.

DETAILED DESCRIPTION OF THE INVENTION

The best mode for carrying out the present invention is described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Resin Having a Repeating Unit Represented by Formula (A), Which Decomposes Under the Action of an Acid to Increase the Solubility in an Alkali Developer The positive resist composition of the present invention comprises a resin having a repeating unit represented by the following formula (A), which decomposes under the action of an acid to increase the solubility in an alkali developer (hereinafter sometimes referred to as a "resin (A)").

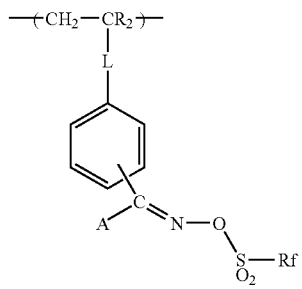

In formula (A), $R_2$ represents a hydrogen atom, an alkyl group, a cyano group or a halogen atom.

L represents a single bond or a divalent linking group.

A represents a monovalent organic group.

Rf represents an alkyl group, a cycloalkyl group or an aryl group.

The alkyl group of $R_2$ is preferably a linear alkyl group having a carbon number of 1 to 3 and may be substituted by a fluorine atom, a hydroxyl group or the like.

$R_2$ is preferably a hydrogen atom or a methyl group.

L is specifically a single bond, an alkylene group, an aralkylene group, an arylene group, an ester group, an amido group or an ether group, preferably a single bond, an arylene group, an ester group or an amido group, more preferably a single bond or an ester group.

The monovalent organic group of A is preferably, for example, an alkyl group (preferably having a carbon number of 1 to 10), a cycloalkyl group (preferably having a carbon number of 3 to 10), an aryl group (preferably having a carbon number of 6 to 10), a halogen atom, a nitro group or a cyano group. The alkyl group, cycloalkyl group and aryl group each may be substituted by a halogen atom, a cyano group, a nitro group or the like.

A is more preferably an alkyl group, a fluorine-containing alkyl group or a cyano group.

Rf is preferably an alkyl group having a carbon number of 1 to 10, a cycloalkyl group having a carbon number of 3 to 15, or an aryl group having a carbon number of 6 to 20. These groups each preferably has a substituent. Examples of the substituent include an alkyl group, a cycloalkyl group, a halogen atom, an alkoxy group, a hydroxyl group, an amido group, an ester group, a cyano group, a nitro group and a sulfide group. Among these, preferred are a halogen atom (more preferably a fluorine atom), a linear or branched alkyl group having a carbon number of 1 to 10, and a cycloalkyl group having a carbon number of 3 to 10.

Specific examples of the repeating unit represented by formula (A) are set forth below, but the present invention is not limited thereto.

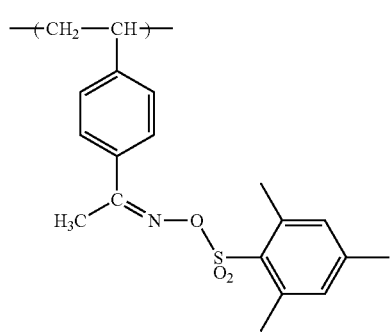 (I-1)
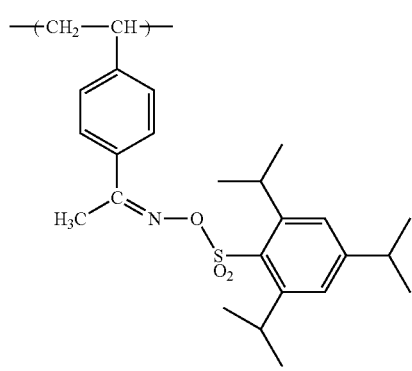 (I-2)
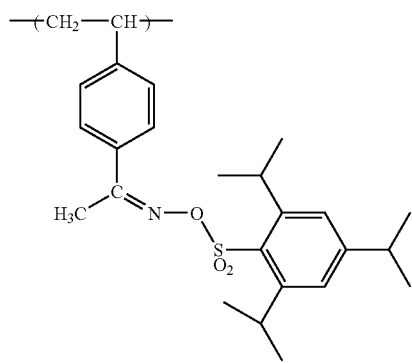 (I-3)
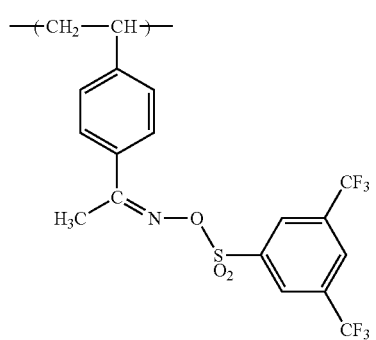 (I-4)
-continued
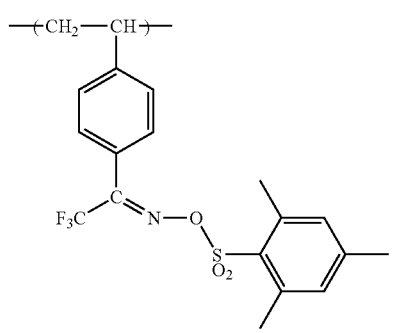 (I-5)
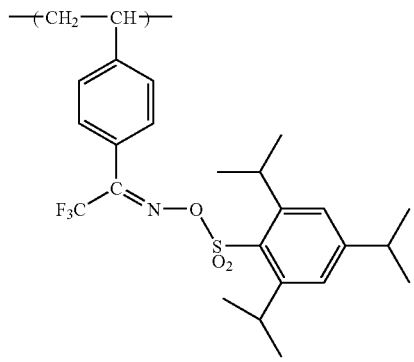 (I-6)
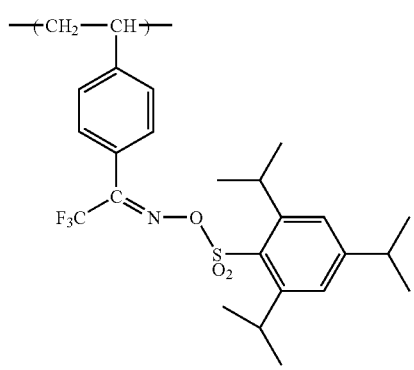 (I-7)
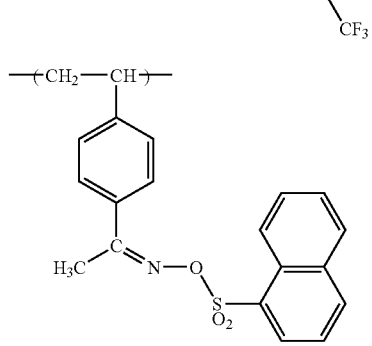 (I-8)
(I-9)

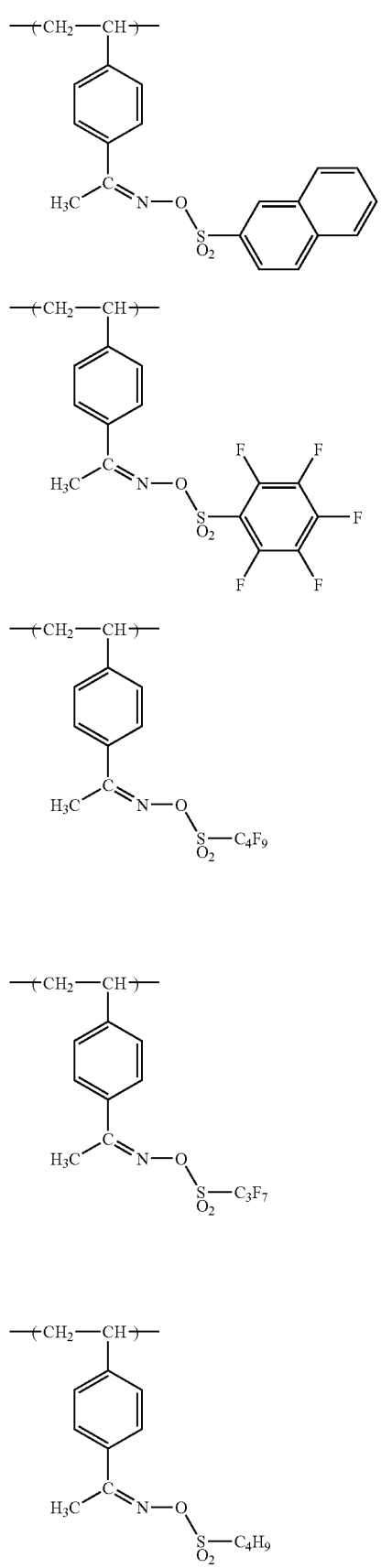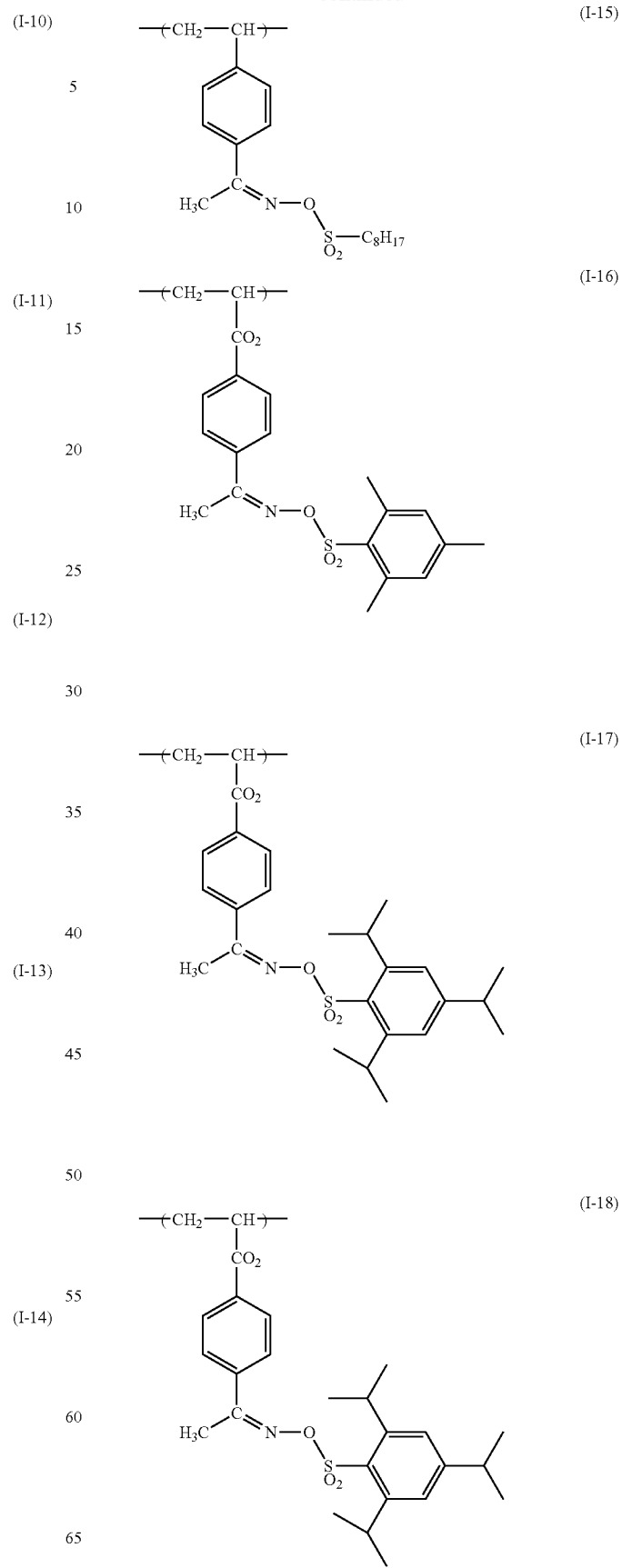

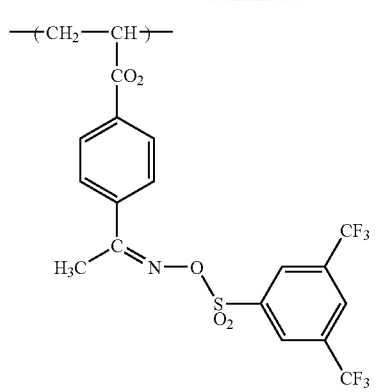
(I-19)
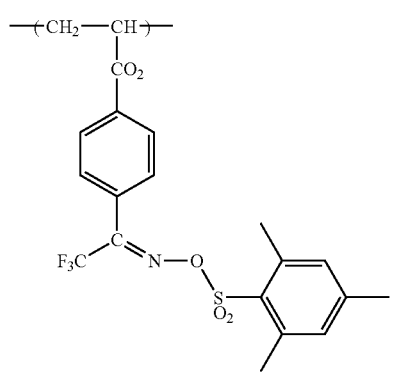
(I-20)
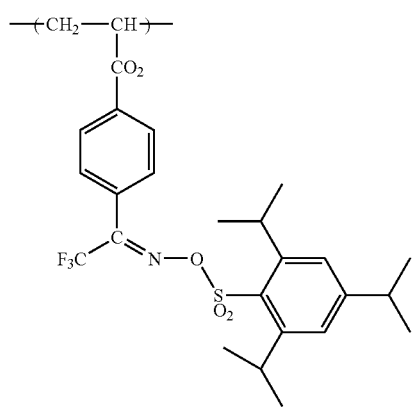
(I-21)
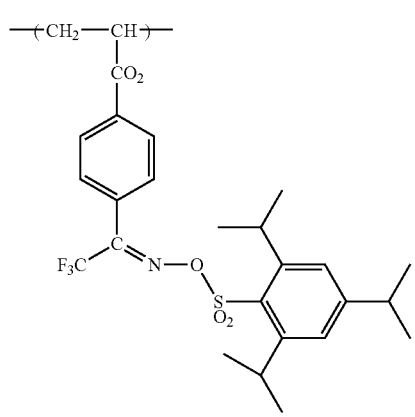
(I-22)
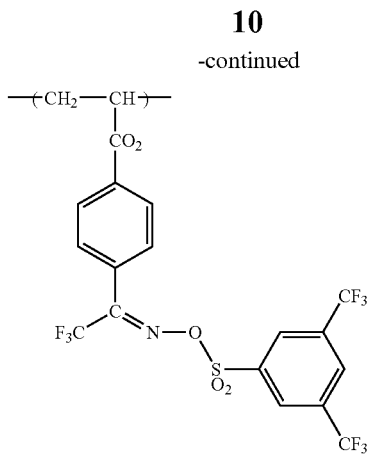
(I-23)
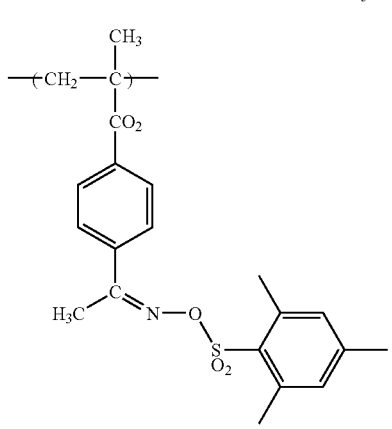
(I-24)
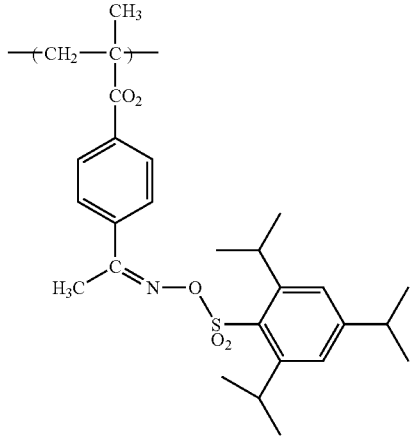
(I-25)
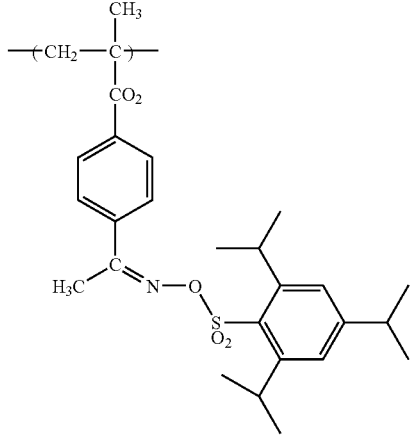
(I-26)

(I-27)
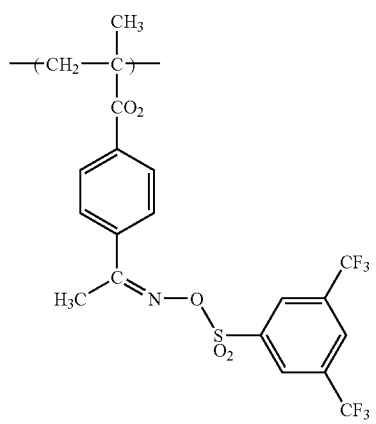
(I-28)
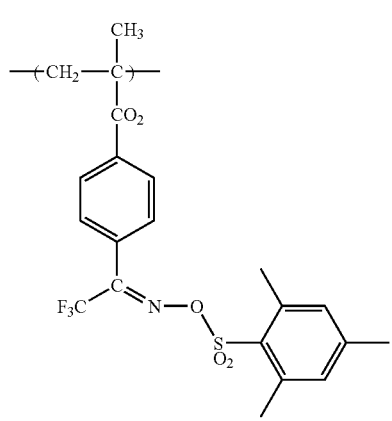
(I-29)
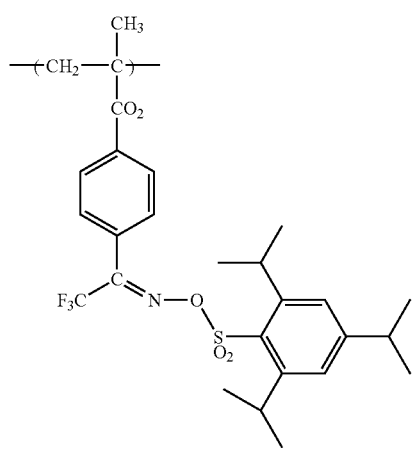
(I-30)
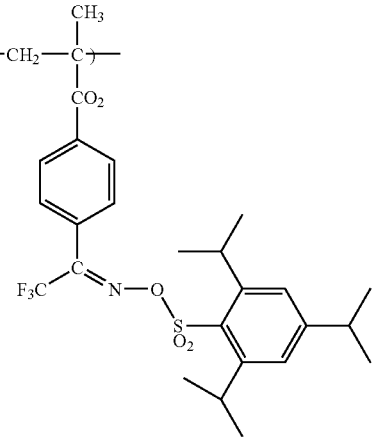
(I-31)
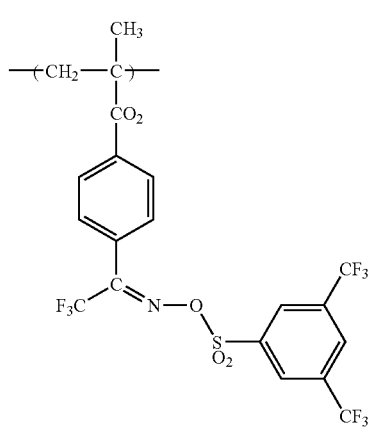
(I-32)
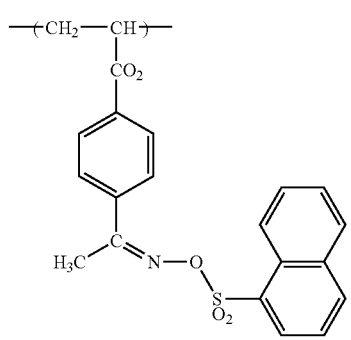
(I-33)
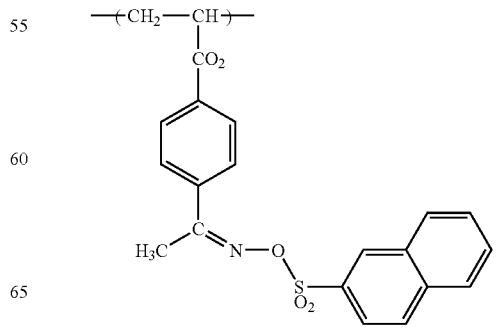

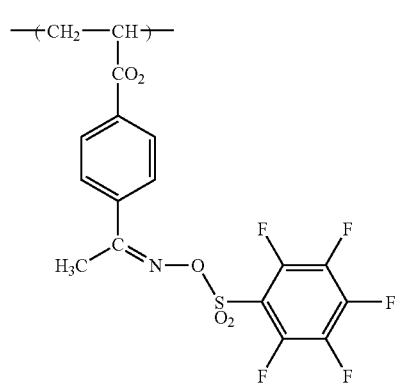
(I-34)
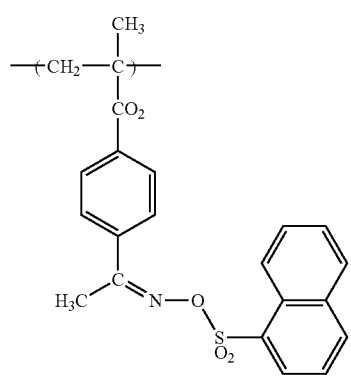
(I-35)
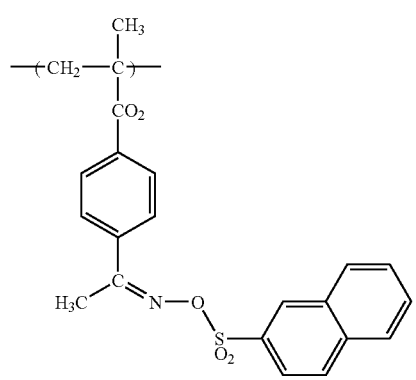
(I-36)
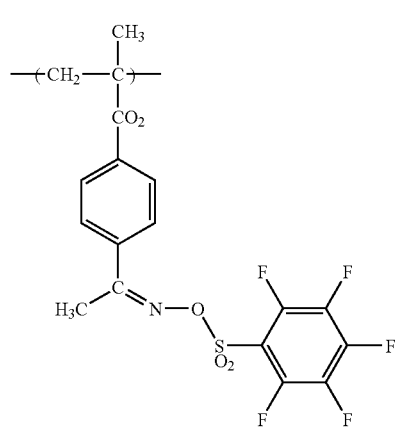
(I-37)
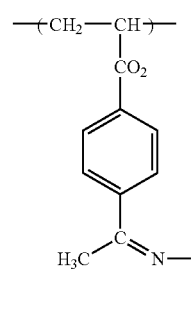
(I-38)
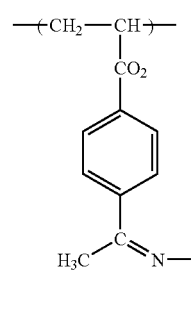
(I-39)
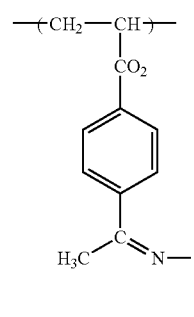
(I-40)
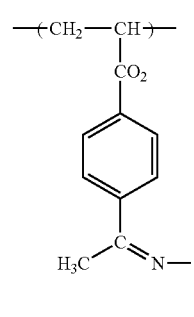
(I-41)
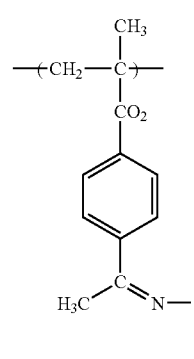
(I-42)

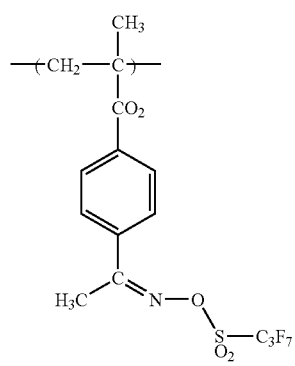
(I-43)
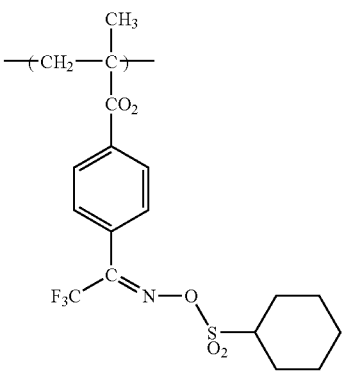
(I-47)
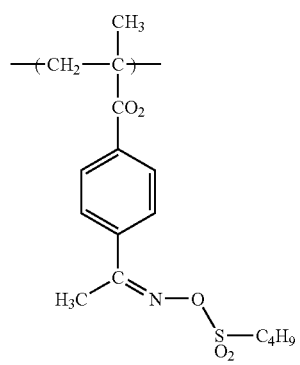
(I-44)
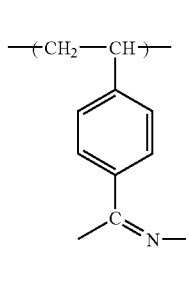
(I-48)
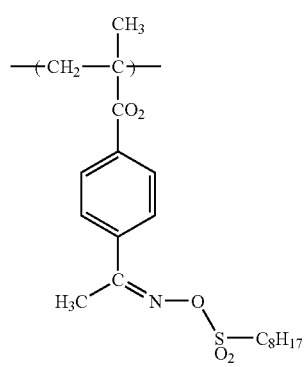
(I-45)
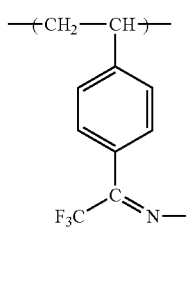
(I-49)
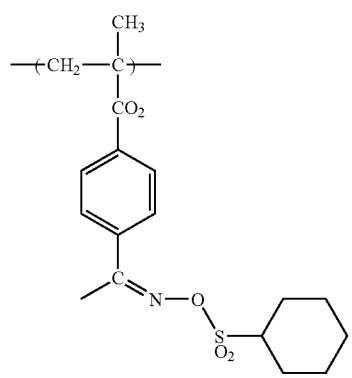
(I-46)
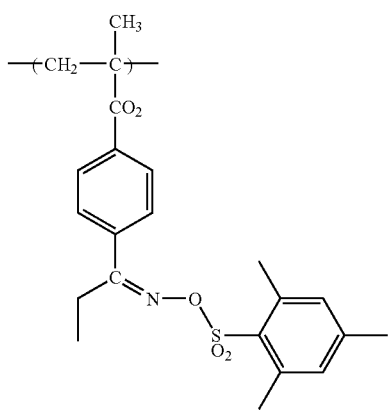
(I-50)

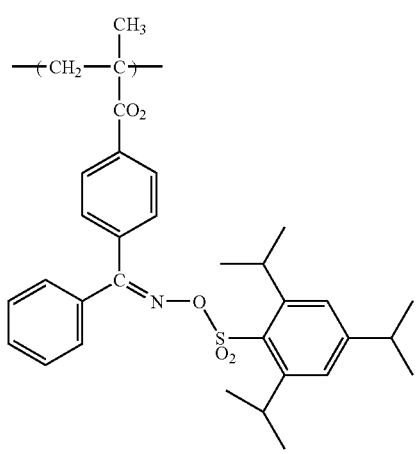 (I-51)
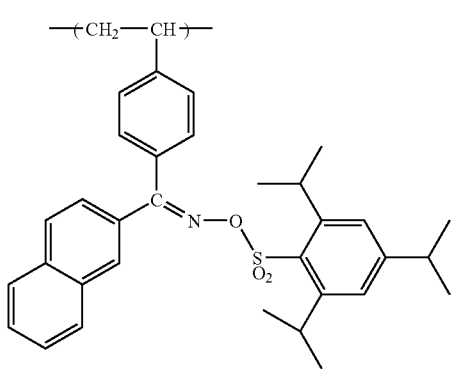 (I-52)
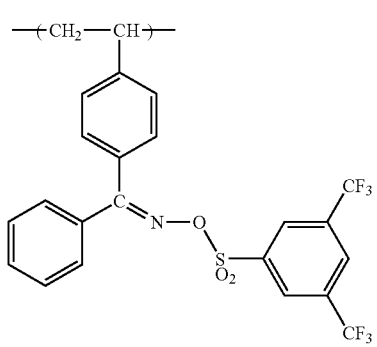 (I-53)
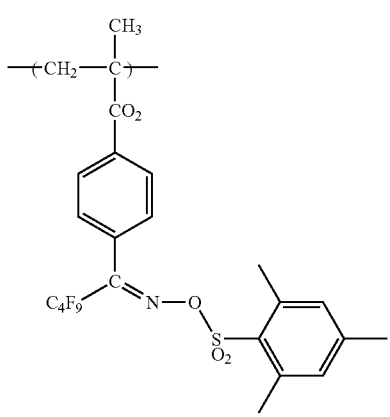 (I-54)
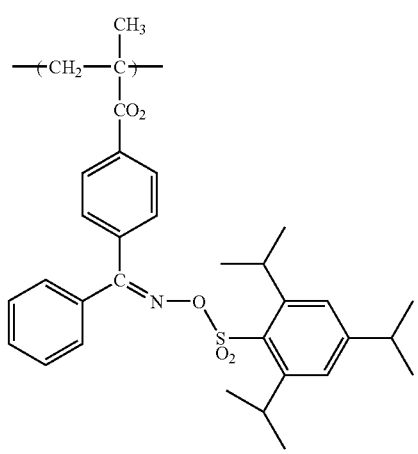 (I-55)
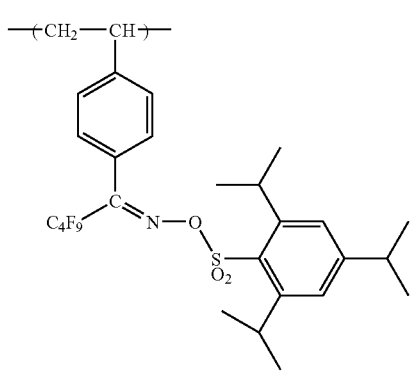 (I-56)
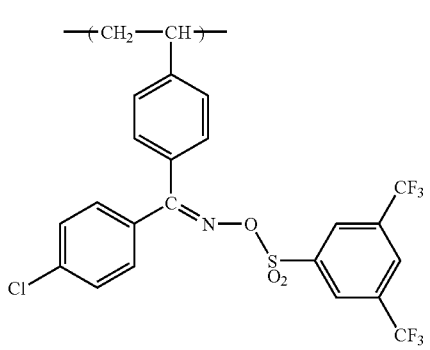 (I-57)
The resin (A) preferably further contains a repeating unit represented by the following formula (1) and/or a repeating unit represented by formula (2):
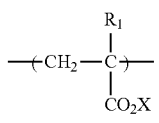 (1)

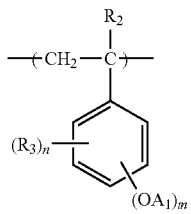
(2)

In formula (1), $R_1$ represents a hydrogen atom, an alkyl group, a cyano group or a halogen atom.

X represents a group which leaves under the action of an acid.

In formula (2), $R_2$ represents a hydrogen atom, an alkyl group, a cyano group or a halogen atom.

$R_3$ represents, when a plurality of $R_3$'s are present, each independently represents, an alkyl group, a halogen atom, an aryl group, an alkoxy group, an alkoxycarbonyl group or an acyl group.

n represents an integer of 0 to 4.

$A_1$ represents, when a plurality of $A_1$'s are present, each independently represents, a hydrogen atom, a group which leaves under the action of an acid, or a group having a group which decomposes under the action of an acid.

m represents an integer of 1 to 5.

Here, $m+n \leq 5$.

In formula (1), the alkyl group of $R_1$ is preferably an alkyl group having a carbon number of 1 to 4, more preferably a methyl group. The alkyl group of $R_1$ may be substituted by a fluorine atom or the like. The substituted alkyl group includes a perfluoro group (indicates a $C_mF_{2m+1}$ group, wherein m is an integer of 1 to 4).

$R_1$ is preferably a hydrogen atom, a methyl group or a $C_mF_{2m+1}$ group (wherein m is preferably 1), more preferably a hydrogen atom or a methyl group.

In formula (1), the group which leaves under the action of an acid as X is a group which leaves under the action of an acid generated upon exposure and generates a carboxylic acid derived from an ester group in the structure of formula (1).

The group which leaves under the action of an acid as X preferably has an alicyclic group, and the alicyclic group may be a crosslinked alicyclic group.

The group which leaves under the action of an acid as X is preferably a group represented by any one of the following formulae (pI) to (pVI):

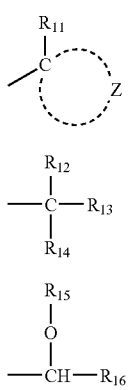

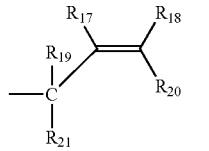
(pIV)

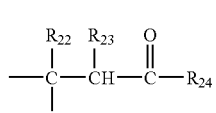
(pV)

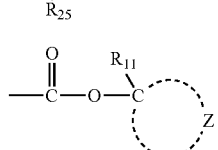
(pVI)

In these formulae, $R_{11}$ represents a methyl group, an ethyl group, an n-propyl group, an isopropyl group, an n-butyl group, an isobutyl group or a sec-butyl group.

Z represents an atomic group necessary for forming an alicyclic hydrocarbon group together with the carbon atom.

$R_{12}$ to $R_{16}$ each independently represents a linear or branched alkyl group having a carbon number of 1 to 4 or an alicyclic hydrocarbon group.

$R_{17}$ to $R_{21}$ each independently represents a hydrogen atom, a linear or branched alkyl group having a carbon number of 1 to 4 or an alicyclic hydrocarbon group, provided that at least either $R_{19}$ or $R_{21}$ represents a linear or branched alkyl group having a carbon number of 1 to 4 or an alicyclic hydrocarbon group.

$R_{22}$ to $R_{25}$ each independently represents a hydrogen atom, a linear or branched alkyl group having a carbon number of 1 to 4 or an alicyclic hydrocarbon group. $R_{23}$ and $R_{24}$ may combine with each other to form a ring.

In formulae (pI) to (pVI), the alkyl group in $R_{12}$ to $R_{25}$ is a linear or branched alkyl group having a carbon number of 1 to 4, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group in $R_{12}$ to $R_{25}$ and the alicyclic hydrocarbon group formed by Z together with the carbon atom may be either monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These alicyclic hydrocarbon groups each may have a substituent.

Examples of the structure of the alicyclic moiety in the alicyclic hydrocarbon group are set forth below.

(1)

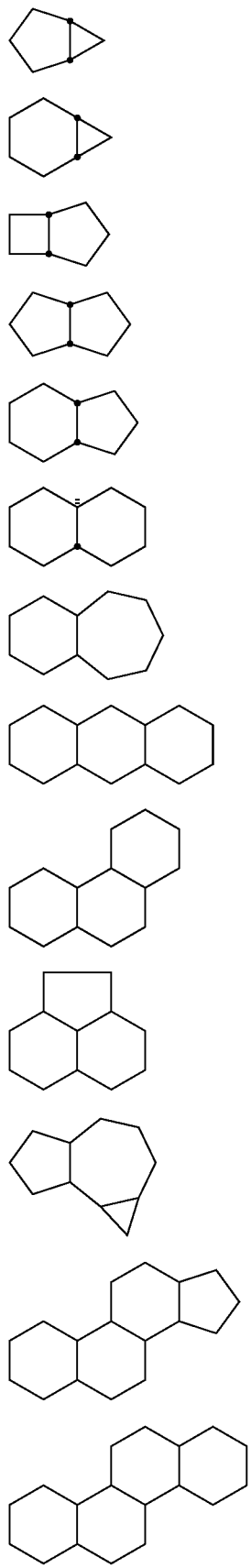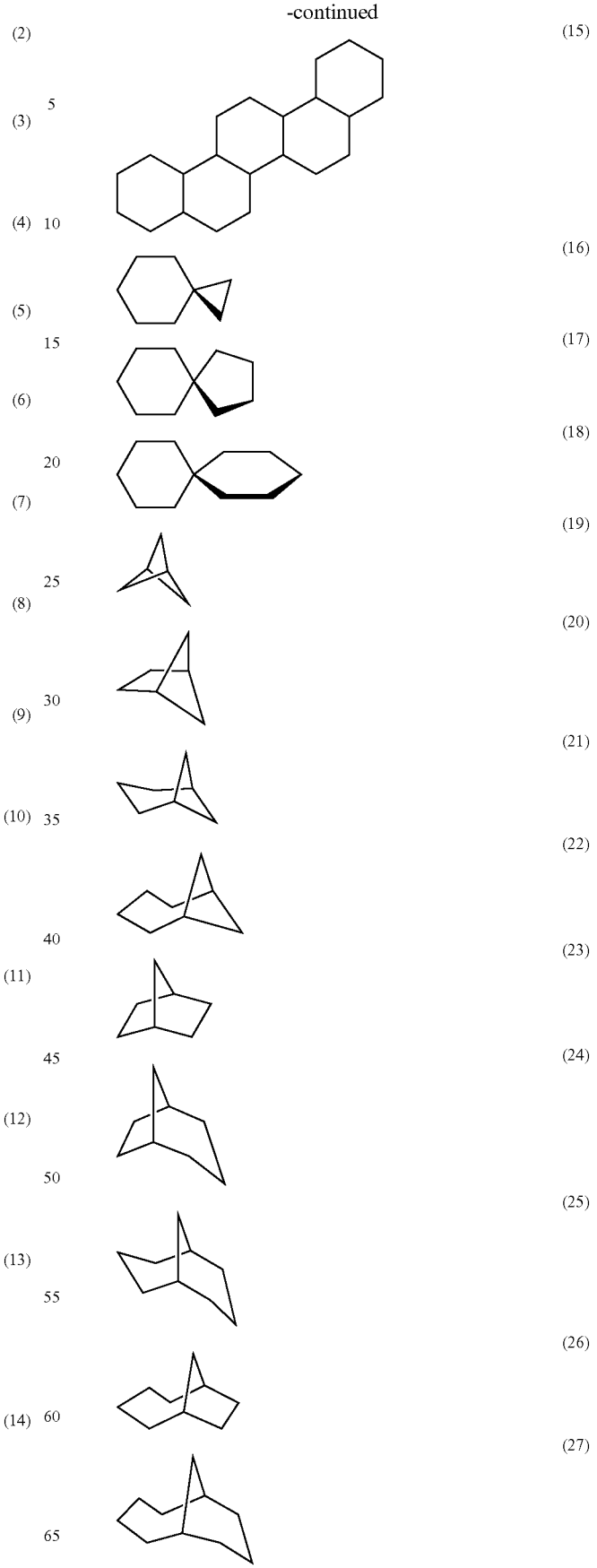

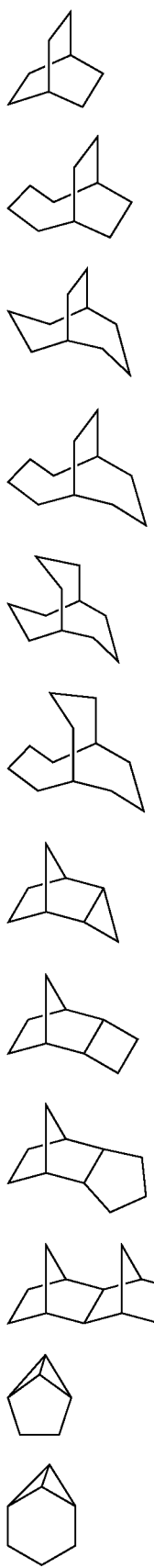
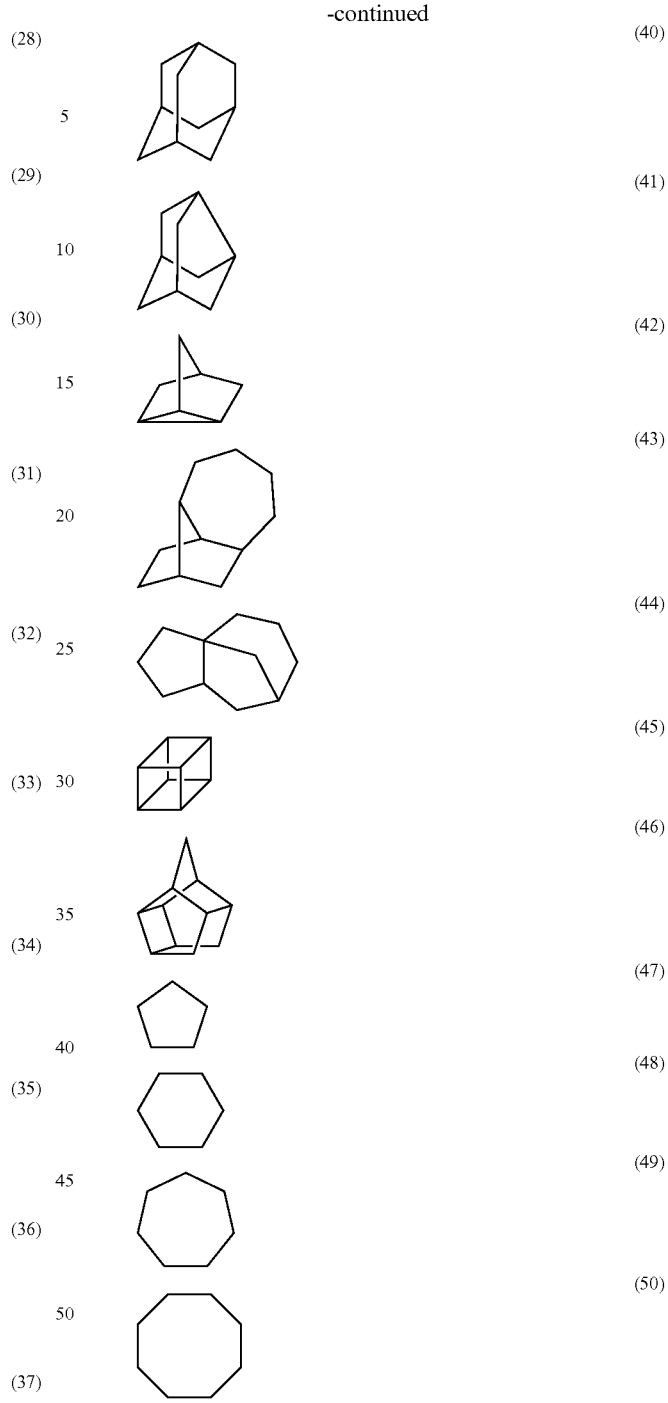

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent for the alicyclic hydrocarbon group include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group includes an alkoxy group having a carbon number of 1 to 4, such as methoxy group, ethoxy group, propoxy group and butoxy group. The alkyl group and alkoxy group each may further have a substituent, and examples of the substituent which the alkyl group and alkoxy group each may further have include a hydroxyl group, a halogen atom and an alkoxy group.

X is particularly preferably a group represented by the following formula (3):

$$\begin{array}{c} R_4 \\ | \\ \text{---}\text{C}\text{---}Y \\ | \\ R_5 \end{array} \quad (3)$$

In formula (3), $R_4$ and $R_5$ each independently represents an alkyl group, and Y represents an alicyclic group.

The group represented by formula (3) includes a group where one of $R_{12}$ to $R_{14}$ in formula (pII) is an alicyclic group.

In view of sensitivity and resolution, the group which leaves under the action of an acid as X is also preferably a group represented by the following formula (pVII):

$$\begin{array}{c} R_{26} \\ | \\ \text{---}\text{C}\text{---}R_{27} \\ | \\ H \end{array} \quad (\text{pVII})$$

In formula (pVII), $R_{26}$ represents an alkyl group.

$R_{27}$ represents an aryl group.

The alkyl group of $R_{26}$ in formula (pVII) is the same as the alkyl group in $R_{12}$ to $R_{25}$ of formulae (pII) to (pVI).

The aryl group of $R_{27}$ is preferably an aryl group having a carbon number of 6 to 14, more preferably a phenyl group or a naphthyl group.

The alkyl group of $R_{26}$ and the aryl group of $R_{27}$ each may have a substituent such as alkyl group, aralkyl group, halogen atom, nitro group, cyano group, hydroxy group, alkoxy group, acyl group and acyloxy group.

Specific examples of the repeating unit represented by formula (1) or the monomer corresponding thereto are set forth below, but the present invention is not limited thereto.

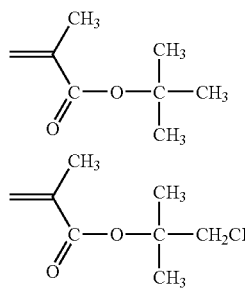
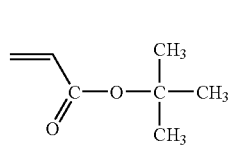
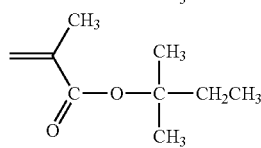

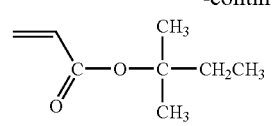

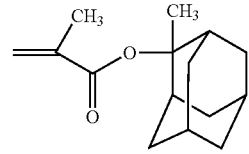
1

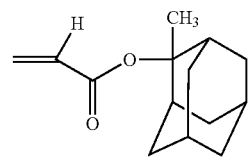
2

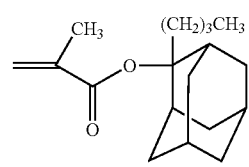
3

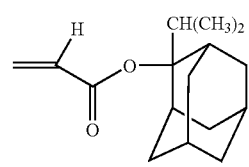
4

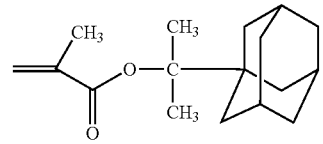
5

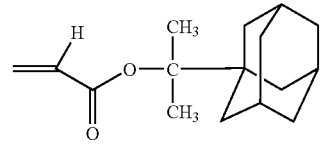
6

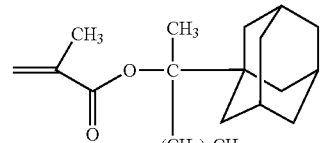
7

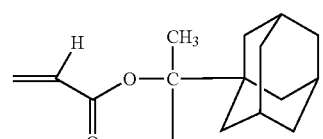
8

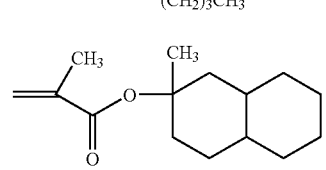
9

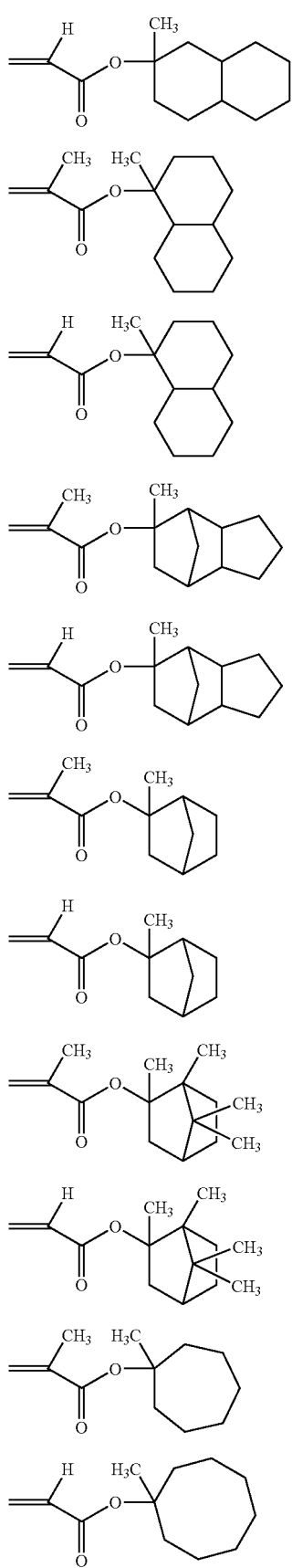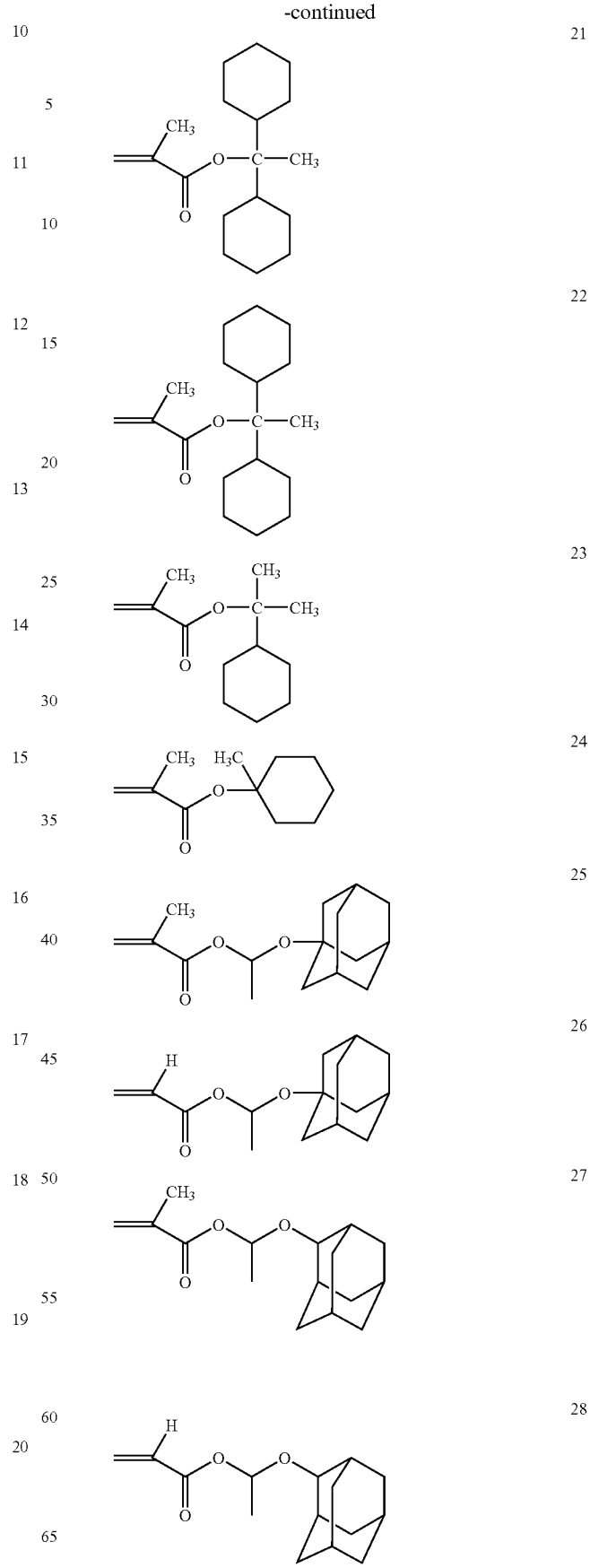

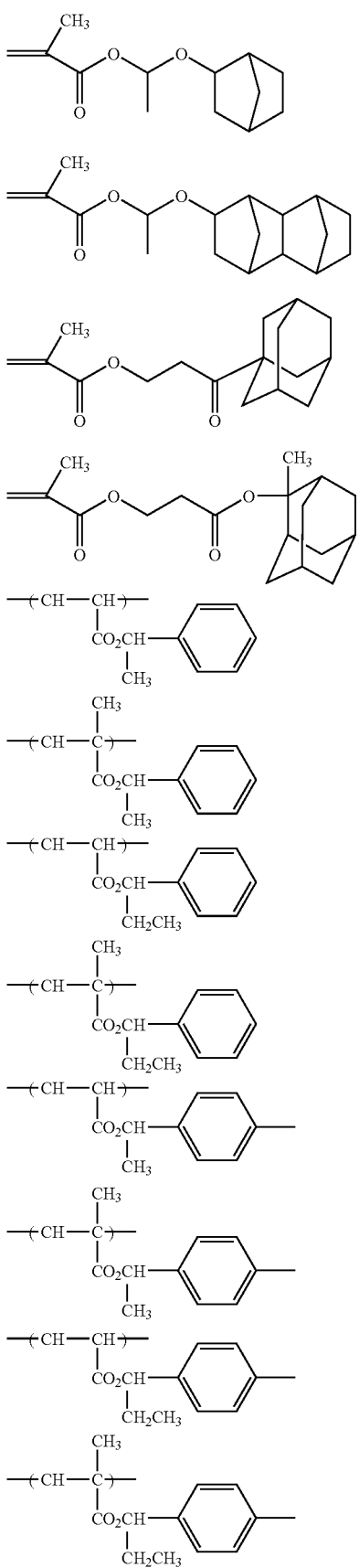
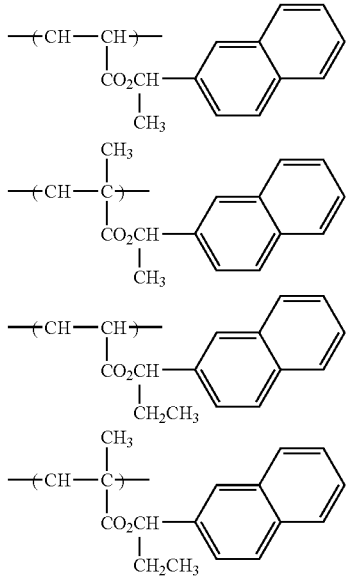

In formula (2), $R_2$ has the same meaning as $R_1$ in formula (1).

The alkyl group as $R_3$ may have a substituent and is preferably an alkyl group having a carbon number of 1 to 8, and examples thereof include a methyl group, an ethyl group, a propyl group, an n-butyl group, a sec-butyl group, a hexyl group and an octyl group.

The alkoxy group as $R_3$ and the alkoxy group in the alkoxycarbonyl group each may have a substituent and is preferably an alkoxy group having a carbon number of 1 to 8, and examples thereof include a methoxy group, an ethoxy group, a propoxy group, a butoxy group, a pentyloxy group, a hexyloxy group and a cyclohexyloxy group.

The aryl group as $R_3$ may have a substituent and is preferably an aryl group having a carbon number of 6 to 15, and examples thereof include a phenyl group, a tolyl group, a naphthyl group and an anthryl group.

The acyl group as $R_3$ may have a substituent and is preferably an acyl group having a carbon number of 2 to 8, and examples thereof include a formyl group, an acetyl group, a propanoyl group, a butanoyl group, a pivaloyl group and a benzoyl group.

Examples of the substituent which these groups each may have include a hydroxyl group, a carboxyl group, a halogen atom (fluorine, chlorine, bromine, iodine), and an alkoxy group (e.g., methoxy, ethoxy, propoxy, butoxy).

Examples of the group which leaves under the action of an acid of $A_1$ include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently represents an alkyl group, a cycloalkyl group, an aryl group, an aralkyl group or an alkenyl group. $R_{36}$ and $R_{37}$ may combine with each other to form a ring.

$R_{01}$ and $R_{02}$ each independently represents a hydrogen atom, an alkyl group, a cycloalkyl group, an aryl group, an aralkyl group or an alkenyl group.

Examples of the group having a group which decomposes under the action of an acid of $A_1$ include an alkyl group, a cycloalkyl group, and an aryl group, each having a group which decomposes under the action of an acid (acid-decomposable group).

The group preferred as the acid-decomposable group includes a group where the hydrogen atom of a —COOH group or —OH group is substituted by a group which leaves under the action of an acid.

In formula (2), the $OA_1$ group may be present at any position on the benzene ring but is preferably present at the meta- or para-position of the styrene skeleton, more preferably at the para-position.

Specific examples of the repeating unit represented by formula (2) are set forth below, but the present invention is not limited thereto.

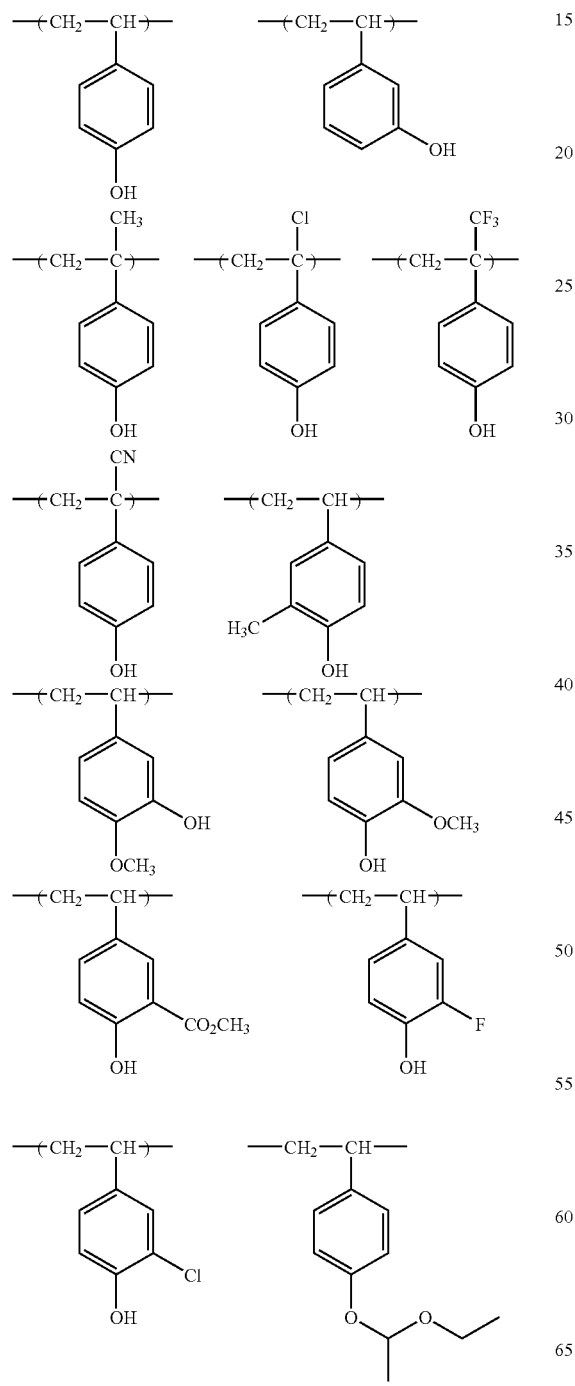
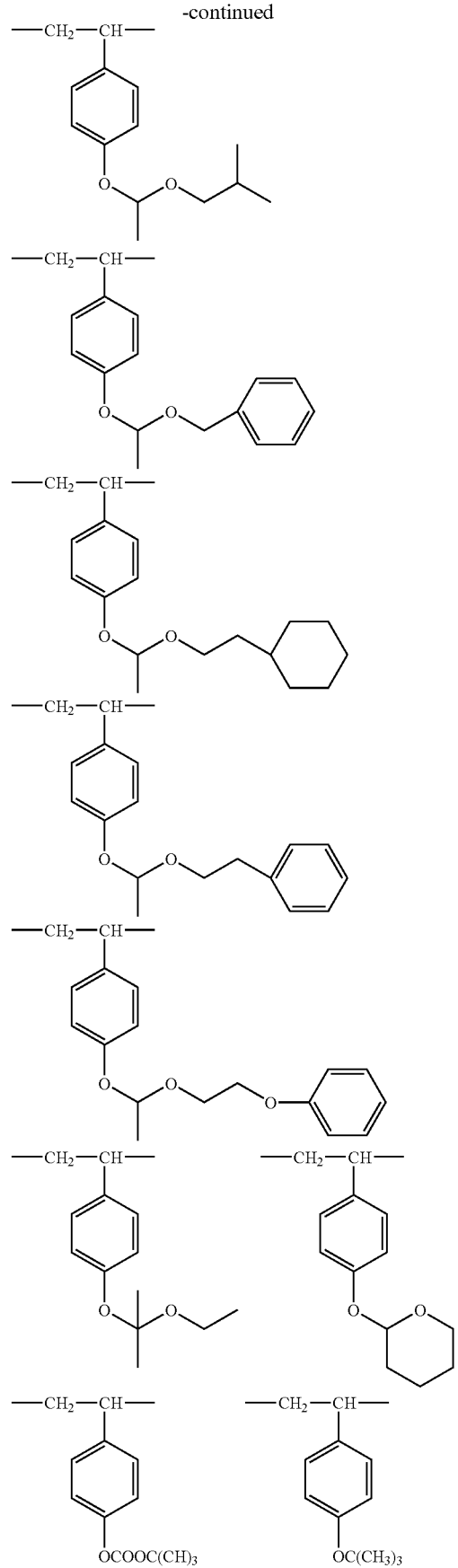

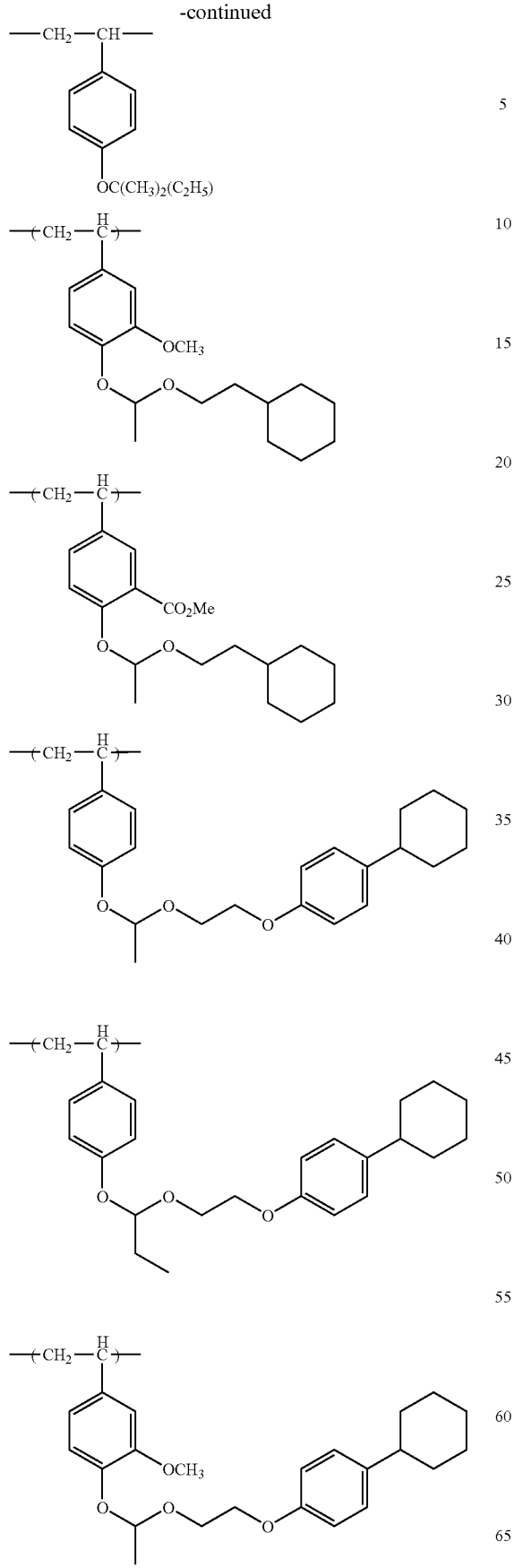
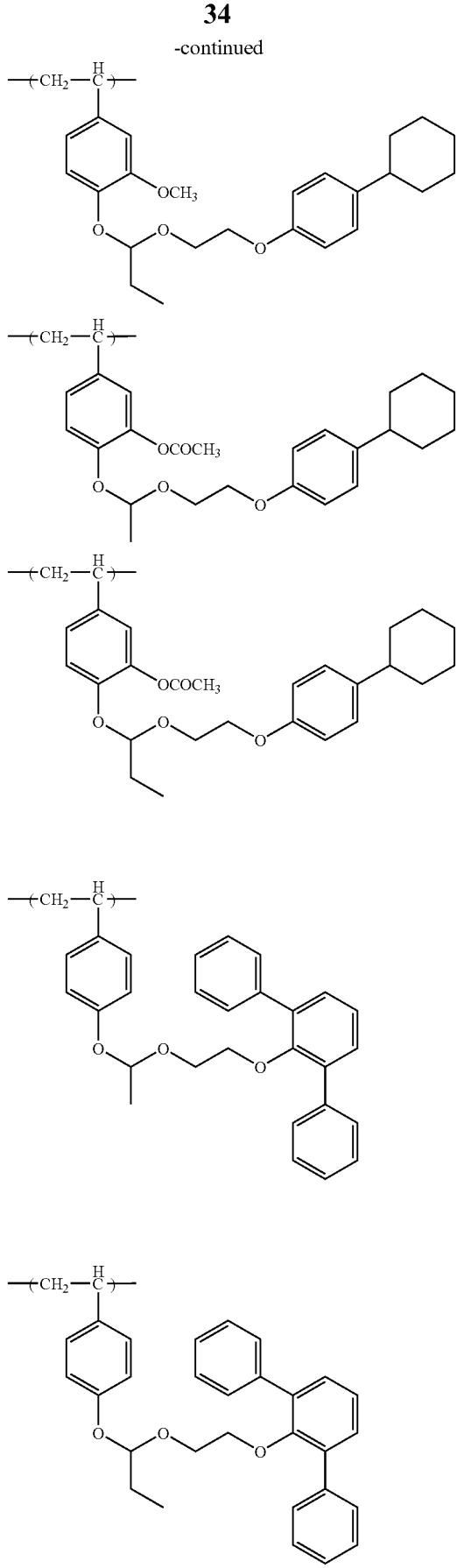

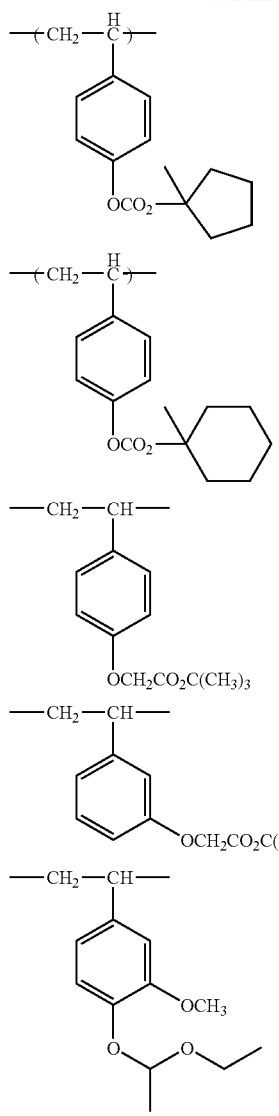

It is also preferred that the resin (A) further has a repeating unit represented by the following formula (4):

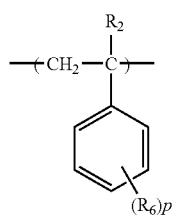

(4)

In formula (4), $R_2$ represents a hydrogen atom, an alkyl group, a cyano group or a halogen atom.

$R_6$ represents, when a plurality of $R_6$'s are present, each independently represents, a monovalent organic group not having a property of decomposing under the action of an acid, a halogen atom or a nitro group.

p represents an integer of 0 to 5.

In formula (4), $R_2$ has the same meaning as $R_2$ in formula (2).

Specific examples of the monovalent organic group not having a property of decomposing under the action of an acid (sometimes referred to as an acid-stable group) of $R_6$ include an alkyl group, a cycloalkyl group, an alkenyl group, an aryl group, an alkyloxy group, a cycloalkyloxy group, an alkenyloxy group, an aryloxy group, an alkylcarbonyloxy group, an alkylamidomethyloxy group, an alkylamide group, an arylamidomethyl group and an arylamide group. The acid-stable group is preferably an alkyl group, a cycloalkyl group, an alkyloxy group, an alkylcarbonyloxy group, a cycloalkyloxy group, an aryloxy group, an alkylamideoxy group or an alkylamide group, more preferably an alkyl group, a cycloalkyl group, an alkyloxy group, an alkylcarbonyloxy group, a cycloalkyloxy group or an aryloxy group. In the acid-stable group, the cycloalkyl group is preferably a cycloalkyl group having a carbon number of 3 to 10, such as cyclopropyl group, cyclobutyl group, cyclohexyl group and adamantyl group, and the alkenyl group is preferably an alkenyl group having a carbon number of 2 to 4, such as vinyl group, propenyl group, allyl group and butenyl group.

Specific examples of the repeating unit represented by formula (4) are set forth below, but the present invention is not limited thereto.

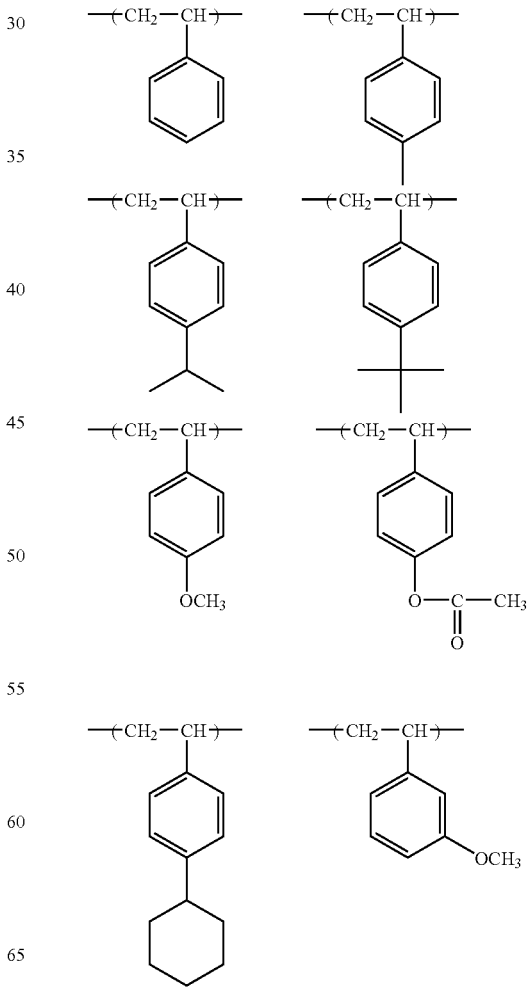

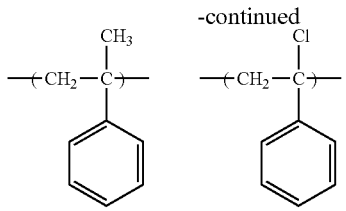

The content of the repeating unit represented by formula (A) in the resin (A) is preferably from 1 to 30 mol %, more preferably from 2 to 20 mol %, still more preferably from 3 to 10 mol %, based on all repeating units.

The content of the repeating unit represented by formula (1) in the resin (A) is preferably from 3 to 80 mol %, more preferably from 5 to 70 mol %, still more preferably from 5 to 50 mol %, based on all repeating units. From the standpoint of unfailingly preventing the film loss in the unexposed area or the reduction of resolving power, the content is preferably 3 mol % or more, and in view of adhesion to substrate and suppression of scumming, the content is preferably 80 mol % or less.

The content of the repeating unit represented by formula (2) in the resin (A) is preferably from 20 to 97 mol %, more preferably from 30 to 95 mol %, still more preferably from 50 to 95 mol %, based on all repeating units. In view of suppressing the adhesion failure to substrate or the generation of scumming, the content is preferably 20 mol % or more, and from the standpoint of unfailingly preventing the film loss in the unexposed area or the reduction of resolving power, the content is preferably 97 mol % or less.

The resin (A) preferably contains a repeating unit represented by formula (4) from the standpoint of, for example, enhancing the film quality and suppressing the film loss in the unexposed area. The content of the repeating unit represented by formula (4) is preferably from 0 to 50 mol %, more preferably from 0 to 40 mol %, still more preferably from 0 to 30 mol %, based on all repeating units.

In the resin (A), for maintaining good developability with an alkali developer, another appropriate polymerizable monomer may be copolymerized so that an alkali-soluble group such as phenolic hydroxyl group or carboxyl group can be introduced, or for enhancing the film quality, another hydrophobic polymerizable monomer such as alkyl acrylate or alkyl methacrylate may be copolymerized.

The resin (A) may contain a repeating unit comprising a monomer having an acid-decomposable group other than the acid-decomposable group contained in formula (1) or (2), and examples of the other acid-decomposable group include a group represented by —C(=O)—X$_1$—R$_0$.

In the formula above, R$_0$ is a tertiary alkyl group such as tert-butyl group and tert-amyl group, a 1-alkoxyethyl group such as isobornyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone group. X$_1$ represents an oxygen atom, a sulfur atom, —NH—, —NHSO$_2$— or —NHSO$_2$NH—.

The weight average molecular weight (Mw) of the resin (A) is preferably from 1,000 to 200,000, more preferably from 1,500 to 100,000, still more preferably from 2,000 to 50,000. From the standpoint of preventing the film loss in the unexposed area, the weight average molecular weight is preferably 1,000 or more, and in view of preventing the resin itself from decreasing in the dissolution rate in an alkali to cause reduction in the sensitivity, the weight average molecular weight is preferably 200,000 or less. The dispersity (Mw/Mn) is preferably from 1.0 to 4.0, more preferably from 1.0 to 3.0, still more preferably from 1.0 to 2.5.

The weight average molecular weight here is defined as a polystyrene-reduced value determined by gel permeation chromatography.

The resin (A) can be synthesized by a general method in the organic chemistry or polymer chemistry.

For example, a monomer represented by the following formula (A') is reacted with a hydroxylamine and converted into an oxime-substituted monomer, and the hydroxyl group of the oxime group is reacted with RfSO$_2$X (wherein X is a halogen atom, and Rf has the same meaning as Rf in formula (A)) in the presence of a basic catalyst to effect sulfonation, whereby a monomer having an oxime ester moiety can be obtained. When the thus-obtained monomer is (co)polymerized by a general polymerization method (e.g., anionic polymerization, radical polymerization, cationic polymerization), the desired resin (A) is obtained.

The resin (A) may also be obtained by (co)polymerizing a monomer represented by the following formula (A') and then introducing an oxime ester moiety through the same polymer reaction process as in the above-described method.

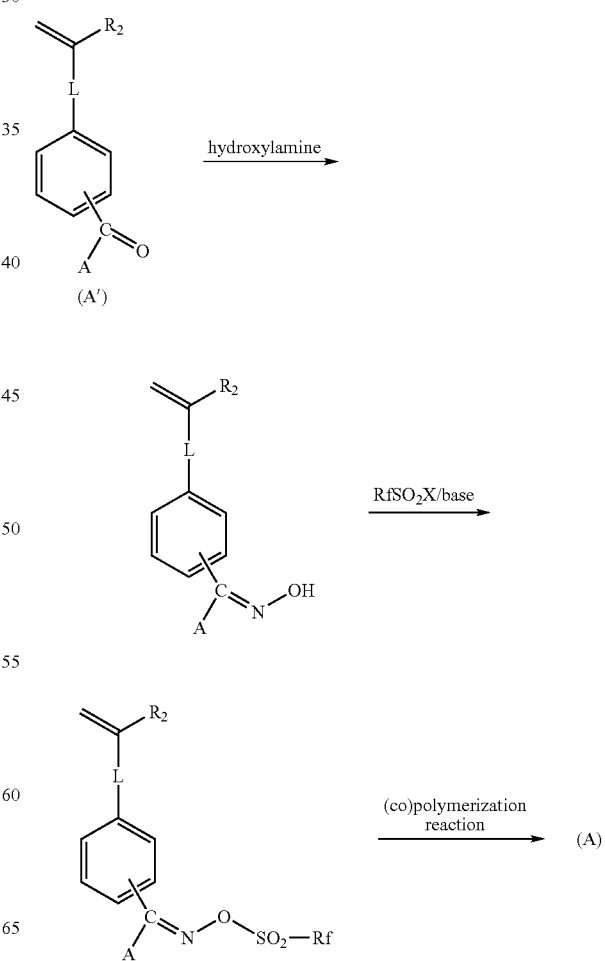

-continued
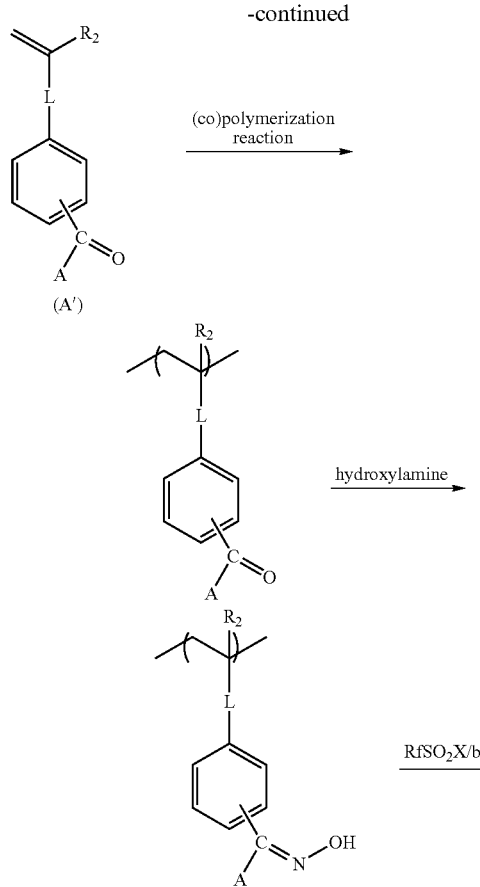
(A')
In the formulae above, $R_2$, L, A and Rf have the same meanings as $R_2$, L, A and Rf in formula (A).
Specific examples of the repeating unit of the resin (A) are set forth below, but the present invention is not limited thereto.
(R-101)
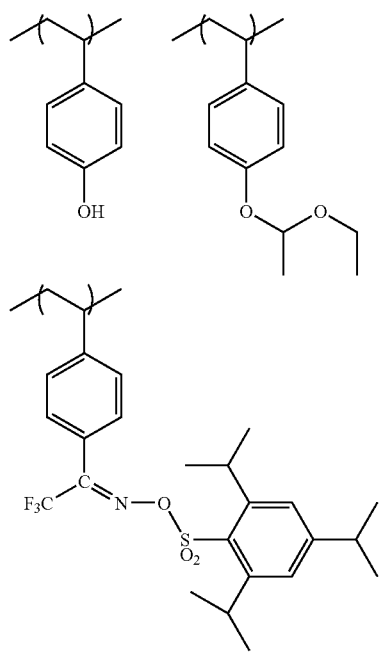
-continued
(R-102)
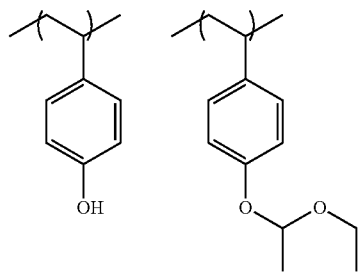
(R-103)
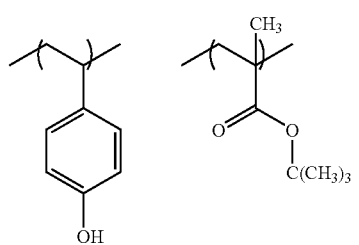
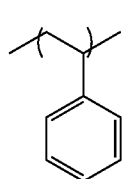
(R-104)
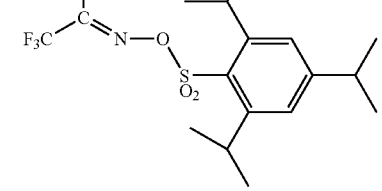

-continued
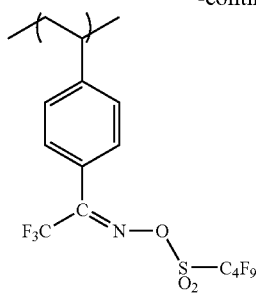 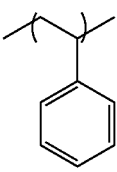
(R-105)
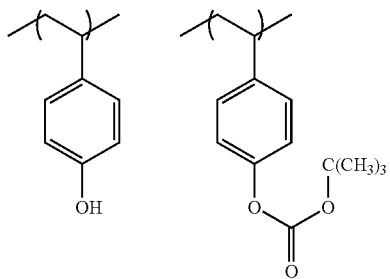
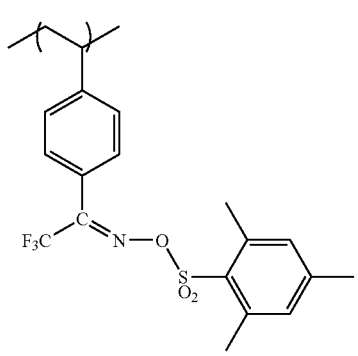
(R-106)
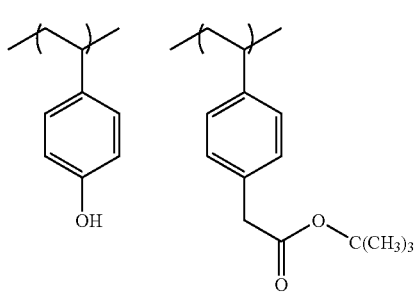
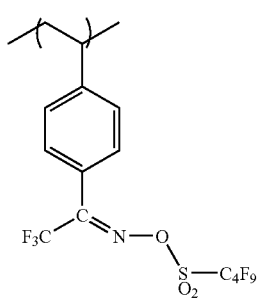
(R-107)
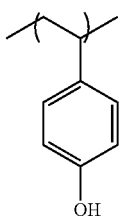 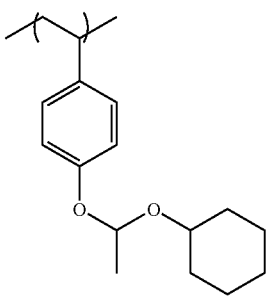
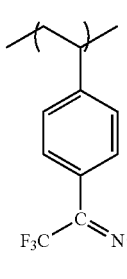
(R-108)
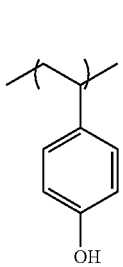
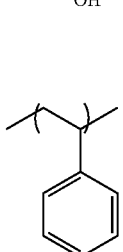
(R-109)
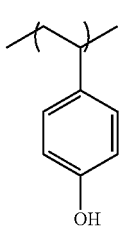 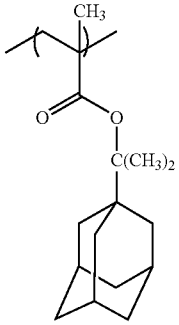

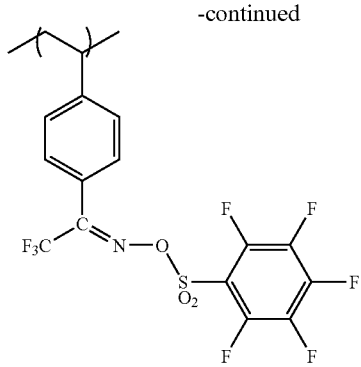
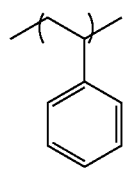
(R-110)
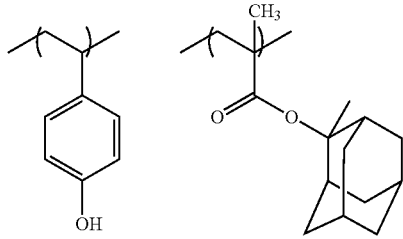
(R-111)
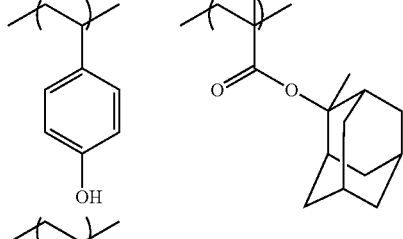
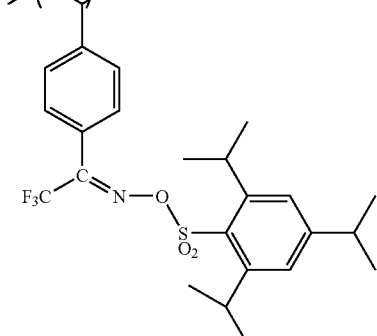
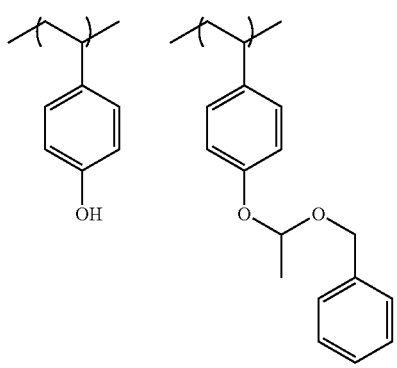
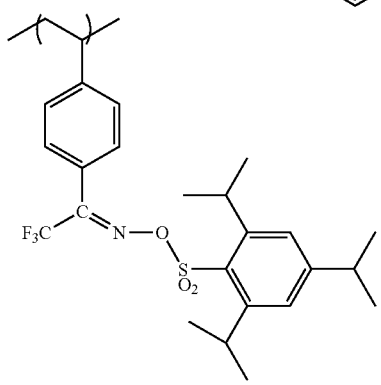
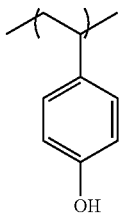
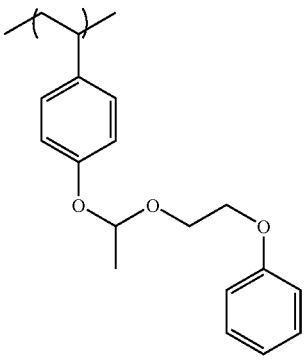
(R-112)
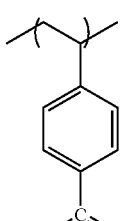
(R-113)
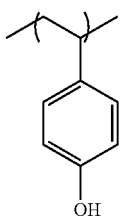
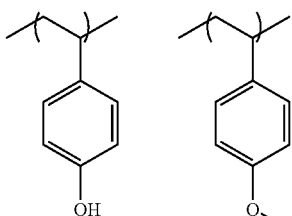
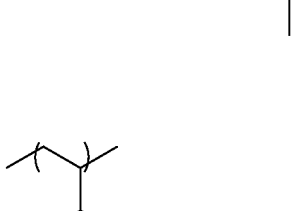
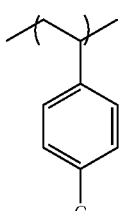
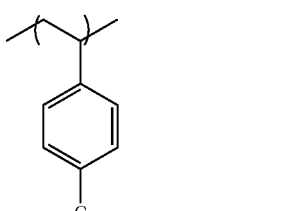
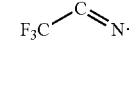
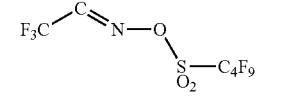
(R-114)
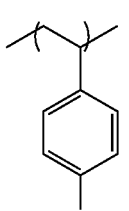
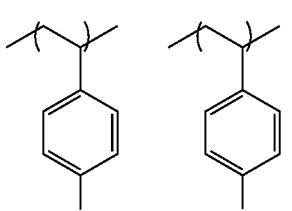
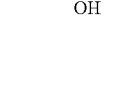
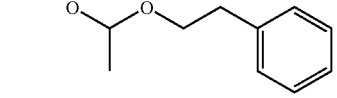

(R-115)
(R-116)
(R-117)
(R-118)
(R-119)

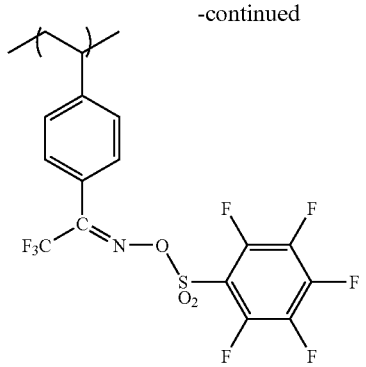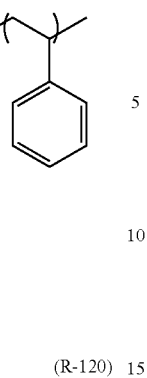
(R-120)
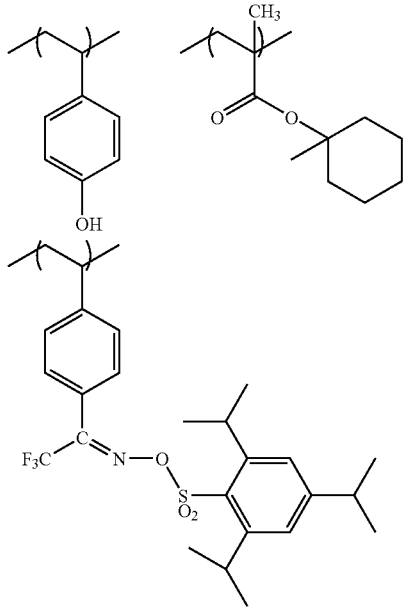
(R-121)
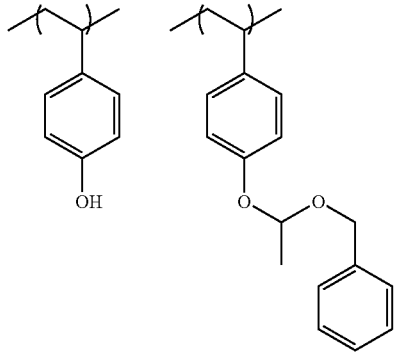
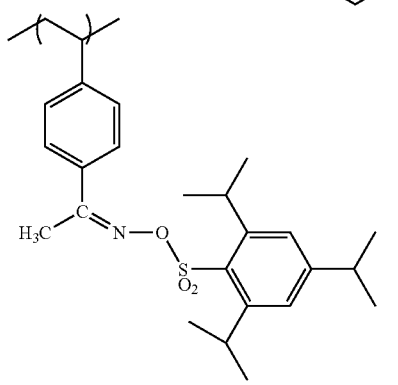
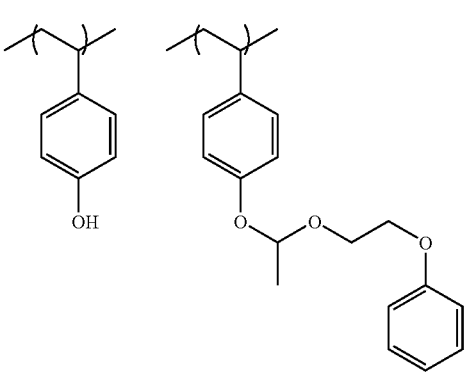
(R-122)
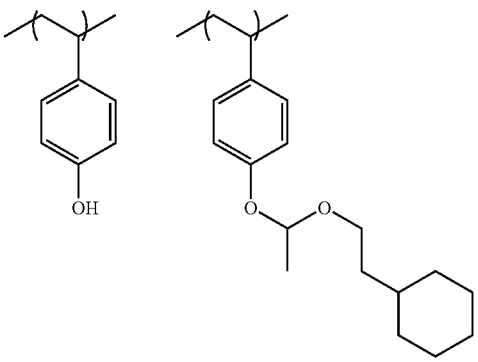
(R-123)

(R-124)
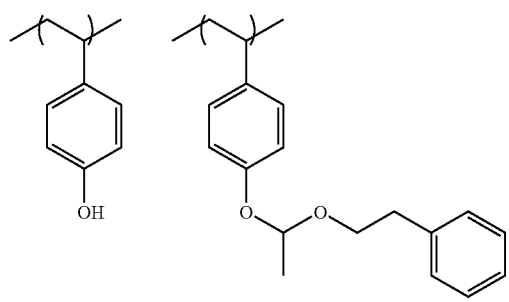
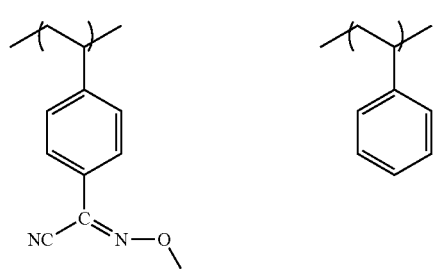
(R-125)
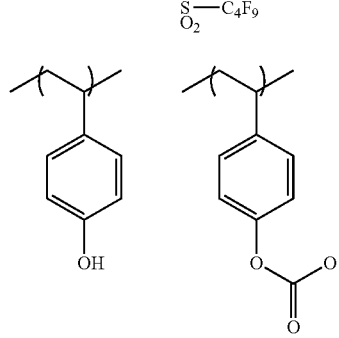
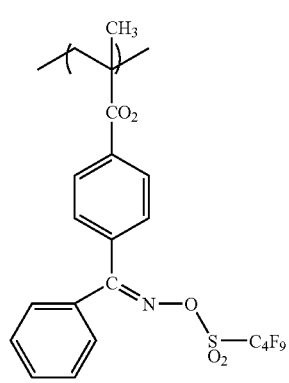
(R-126)
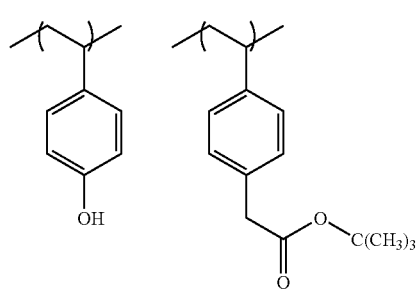
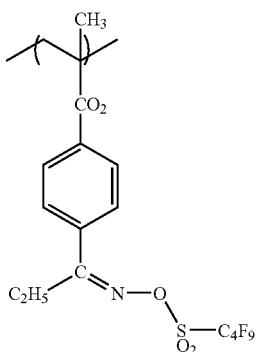
(R-127)
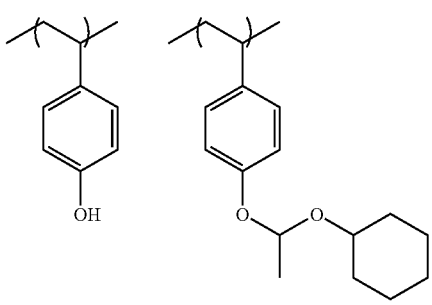
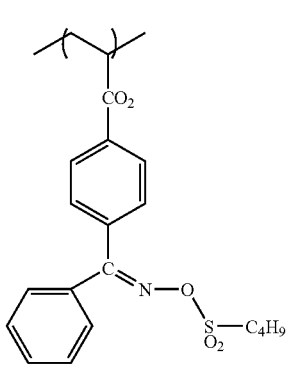
(R-128)
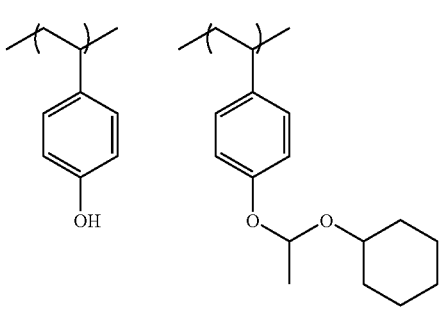
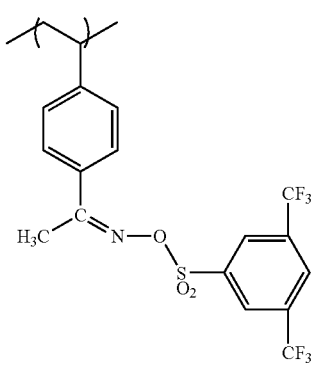

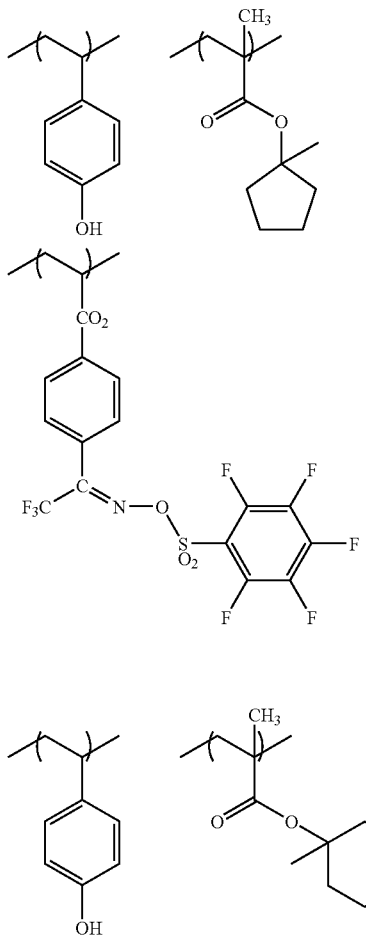

(R-129)

(R-130)

(R-131)

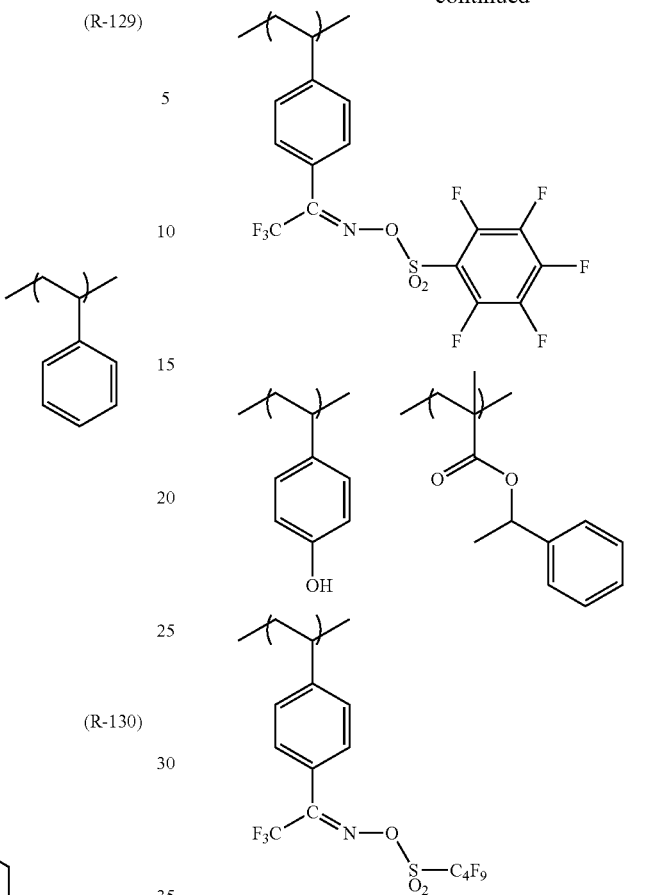

(R-132)

One resin (A) may be used alone, or two or more kinds thereof may be used in combination.

The amount of the resin (A) added is usually from 10 to 99 mass %, preferably from 50 to 99 mass %, more preferably from 70 to 98 mass %, based on the entire solid content of the positive resist composition. (In this specification, mass ratio is equal to weight ratio.)

(B) Compound Capable of Generating Acid Upon Irradiation with Actinic Rays or Radiation The compound capable of generating an acid upon irradiation with actinic rays or radiation (hereinafter, sometimes referred to as an "acid generator") contained in the positive resist composition of the present invention is preferably a compound capable of generating a sulfonic acid upon irradiation with actinic rays or radiation.

The compound capable of generating a sulfonic acid upon irradiation with actinic rays or radiation (hereinafter, sometimes referred to as a "sulfonic acid generator") is a compound which generates a sulfonic acid upon irradiation with actinic rays or radiation such as KrF excimer laser light, electron beam and EUV, and examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where such a group or compound capable of generating a sulfonic acid upon irradiation with actinic rays or radiation is introduced into the main or side chain of a polymer may be used, and examples thereof include compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Furthermore, compounds capable of generating a sulfonic acid by the effect of light described, for example, in U.S. Pat. No. 3,779,778 and European Patent 126,712 may also be used.

In the present invention, from the standpoint of enhancing the resolving power and image performance such as pattern profile, a sulfonium salt, an iodonium salt, an imidosulfonate, an oxime sulfonate, a diazodisulfone and a disulfone are preferred as the sulfonic acid generator.

Out of the sulfonic acid generators, the compounds represented by the following formulae (ZI), (ZII) and (ZIII) are preferred.

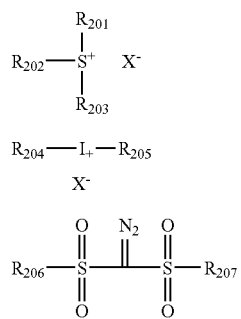

In formula (ZI), $R_{201}$, $R_{202}$ and $R_{203}$ each independently represents an organic group. Two members out of $R_{201}$ to $R_{203}$ may combine to form a ring structure.

$X^-$ represents an organic sulfonate anion.

The number of carbons in the organic group as $R_{201}$, $R_{202}$ and $R_{203}$ is generally from 1 to 30, preferably from 1 to 20.

Examples of the group formed by combining two members out of $R_{201}$ to $R_{203}$ include an alkylene group (e.g., butylene, pentylene), and the ring may contain an oxygen atom, a sulfur atom, an ester bond, an amide bond or a carbonyl group.

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound includes an aryl group composed of hydrocarbon and a heteroaryl group having a heteroatom such as nitrogen atom, sulfur atom and oxygen atom. The aryl group composed of hydrocarbon is preferably a phenyl group or a naphthyl group, more preferably a phenyl group. Examples of the heteroaryl group include a pyrrole group, an indole group, a carbazole group, a furan group and a thiophene group, with an indole group being preferred. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group, a phenylthio group, or the like. The substituent is preferably a linear or branched alkyl group having a carbon number of 1 to 12, a cycloalkyl group having a carbon number of 3 to 12, or an alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

Examples of the organic sulfonate anion of $X^-$ include aliphatic sulfonate anion, aromatic sulfonate anion, sulfonylimide anion, bis(alkylsulfonyl)imide anion, tris(alkylsulfonyl)methyl anion and camphorsulfonate anion.

Examples of the aliphatic group in the aliphatic sulfonate anion include an alkyl group having a carbon number of 1 to 30, such as methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group and eicosyl group, and a cycloalkyl group having a carbon number of 3 to 30, such as cyclopropyl group, cyclopentyl group, cyclohexyl group, adamantyl group, norbornyl group and boronyl group.

The aromatic group in the aromatic sulfonate anion is preferably an aryl group having a carbon number of 6 to 14, such as phenyl group, tolyl group and naphthyl group.

The alkyl group, cycloalkyl group and aryl group in the aliphatic sulfonate anion and aromatic sulfonate anion each may have a substituent.

Examples of the substituent include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7) and an alkylthio group (preferably having a carbon number of 1 to 15). As for the aryl group and ring structure in each group, examples of the substituent further include an alkyl group (preferably having a carbon number of 1 to 15).

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, an n-propyl group, an isopropyl group, an n-butyl group, an isobutyl group, a sec-butyl group, a pentyl group, an isopentyl group, a neopentyl group and a tert-pentyl group. This alkyl group may have a substituent, and examples thereof include a halogen atom, a halogen atom-substituted alkyl group, an alkoxy group and an alkylthio group, with a fluorine atom-substituted alkyl group being preferred.

The organic sulfonate anion of $X^-$ is preferably an aliphatic sulfonate anion with the α-position of the sulfonic acid being substituted by a fluorine atom, or an aromatic sulfonate anion substituted by a fluorine atom or a fluorine atom-containing group. The organic sulfonate anion is more preferably a perfluoro aliphatic sulfonate anion having a carbon number of 4 to 8, or an aromatic sulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

The compound (ZI-2) is described below.

The compound (ZI-2) is a compound where $R_{201}$ to $R_{203}$ in formula (ZI) each independently represents an aromatic ring-free organic group.

The aromatic ring-free organic group as $R_{201}$ to $R_{203}$ generally has a carbon number of 1 to 30, preferably from 1 to 20.

$R_{201}$ to $R_{203}$ each independently represents preferably an alkyl group, a cycloalkyl group, an allyl group or a vinyl group, more preferably a linear, branched or cyclic 2-oxoalkyl group or an alkoxycarbonylmethyl group, and particularly preferably a linear or branched 2-oxoalkyl group.

The alkyl group of $R_{201}$ to $R_{203}$ may be linear or branched and is preferably a linear or branched alkyl group having a carbon number of 1 to 10, and examples thereof include a methyl group, an ethyl group, a propyl group, a butyl group and a pentyl group. The alkyl group is more preferably a linear or branched 2-oxoalkyl group or an alkoxycarbonylmethyl group.

The cycloalkyl group of $R_{201}$ to $R_{203}$ is preferably a cycloalkyl group having a carbon number of 3 to 10, and examples thereof include a cyclopentyl group, a cyclohexyl group and a norbornyl group. The cycloalkyl group is more preferably a cyclic 2-oxoalkyl group.

The 2-oxoalkyl group may be linear, branched or cyclic and is preferably a group having >C=O at the 2-position of the above-described alkyl or cycloalkyl group.

The alkyl group in the alkoxycarbonylmethyl group is preferably an alkyl group having a carbon number of 1 to 5 (e.g., methyl, ethyl, propyl, butyl, pentyl).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

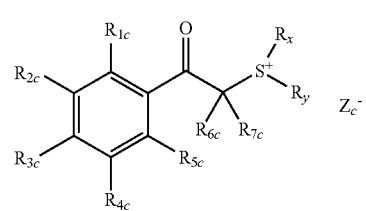

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or the pair of $R_x$ and $R_y$ may combine with each other to form a ring structure, and the ring structure may contain an oxygen atom, a sulfur atom, an ester bond or an amide bond.

$Zc^-$ represents an organic sulfonate anion, and examples thereof are the same as those of the organic sulfonate anion of $X^-$ in formula (ZI).

The alkyl group as $R_{1c}$ to $R_{7c}$ is preferably a linear or branched alkyl group having a carbon number of 1 to 20, and examples thereof include a methyl group, an ethyl group, a linear or branched propyl group, a linear or branched butyl group, and a linear or branched pentyl group.

The cycloalkyl group as $R_{1c}$ to $R_{7c}$ is preferably a cycloalkyl group having a carbon number of 3 to 8, and examples thereof include a cyclopentyl group and a cyclohexyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon atoms of $R_{1c}$ to $R_{5c}$ is from 2 to 15 is more preferred. In this case, the solubility in a solvent is more enhanced and the generation of particles during storage is suppressed.

Examples of the alkyl group and cycloalkyl group as $R_x$ and $R_y$ are the same as those of the alkyl group and cycloalkyl group of $R_{1c}$ to $R_{7c}$. Among these, a 2-oxoalkyl group and an alkoxycarbonylmethyl group are preferred.

Examples of the 2-oxoalkyl group include a group having >C=O at the 2-position of the alkyl or cycloalkyl group of $R_{1c}$ to $R_{7c}$.

Examples of the alkoxy group in the alkoxycarbonylmethyl group are the same as those of the alkoxy group of $R_{1c}$ to $R_{5c}$.

Examples of the group formed by combining any two or more members out of $R_{1c}$ to $R_{7c}$ or the pair of $R_x$ and $R_y$ include a butylene group and a pentylene group.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ includes an aryl group composed of hydrocarbon, and an aryl group having a heteroatom such as nitrogen atom, sulfur atom and oxygen atom. The aryl group composed of hydrocarbon is preferably a phenyl group or a naphthyl group, more preferably a phenyl group. Examples of the heteroaryl group include a pyrrole group, an indole group, a carbazole group, a furan group and a thiophene group, with an indole group being preferred.

The alkyl group of $R_{204}$ to $R_{207}$ is preferably a linear or branched alkyl group having a carbon number of 1 to 10, and examples thereof include a methyl group, an ethyl group, a propyl group, a butyl group and a pentyl group.

The cycloalkyl group of $R_{204}$ to $R_{207}$ is preferably a cycloalkyl group having a carbon number of 3 to 10, and examples thereof include a cyclopentyl group, a cyclohexyl group and a norbornyl group.

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents an organic sulfonate anion, and examples thereof are the same as those of the organic sulfonate anion of $X^-$ in formula (ZI).

The preferred sulfonic acid generator further includes compounds represented by the following formulae (ZIV), (ZV) and (ZVI).

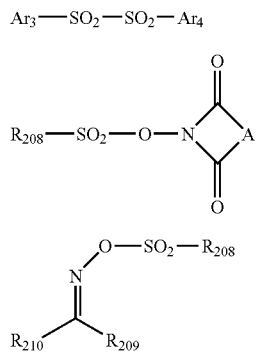

In formulae (ZIV) to (ZVI), $Ar_3$ and $Ar_4$ each independently represents an aryl group.

$R_{208}$, $R_{209}$ and $R_{210}$ each represents an alkyl group, a cycloalkyl group or an aryl group.

A represents an alkylene group, an alkenylene group or an arylene group.

Among the sulfonic acid generators, more preferred are the compounds represented by formulae (ZI) to (ZIII).

The sulfonic acid generator for use in the present invention is particularly preferably a sulfonic acid generator having an anion structure containing a fluorine atom-substituted alkyl group having a carbon number of 4 or less or a fluorine atom-substituted aromatic group, and a triarylsulfonium cation structure. Such a sulfonic acid generator is preferably a compound represented by the following formula (I) or (II):

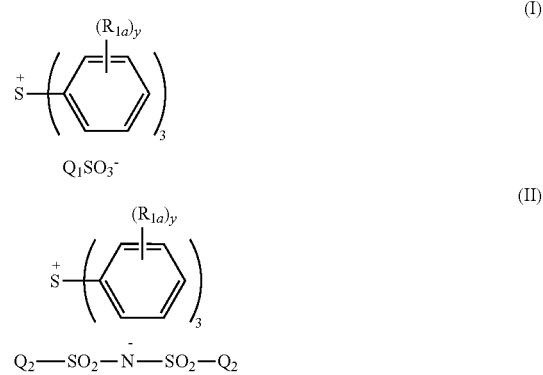

In formulae (I) and (II), each $R_{1a}$ independently represents an alkyl group, an alicyclic hydrocarbon group, a hydroxyl group, a carboxyl group, an alkoxy group or a halogen atom.

y represents 0 or an integer of 1 to 5. When y is an integer of 2 or more, two or more $R_1$'s may be the same or different.

$Q_1$ and $Q_2$ each independently represents a fluorine atom-substituted alkyl group having a carbon number of 1 to 3, a fluorine atom-substituted cycloalkyl group, a fluorine atom-substituted aryl group, or a fluorinated alkyl group-substituted aryl group.

The alkyl group of $R_{1a}$ is preferably a linear or branched alkyl group having a carbon number of 1 to 15, and examples thereof include a methyl group, an ethyl group, a propyl group, an n-butyl group, a sec-butyl group and a tert-butyl group.

Examples of the alicyclic hydrocarbon group of $R_{1a}$ include a cyclopropyl group, a cyclobutyl group, a cyclopentyl group, a cyclohexyl group, a norbornyl group and an adamantyl group.

Examples of the fluorine atom-substituted alkyl group of $Q_1$ and $Q_2$ include —$CF_3$, —$C_2F_5$, -n-$C_3F_7$, —$CF(CF_3)_2$, —$CH(CF_3)_2$, —$(CF_2)_2OCF_2CF_3$, —$(CF_2)_2O(CH_2)_3CH_3$, —$(CF_2)_2O(CH_2)_{13}CH_3$ and —$(CF_2)_2O(CF_2)_2(CH_2)_3CH_3$.

Examples of the fluorine atom-substituted aryl group of $Q_1$ and $Q_2$ include 2,3,4,5,6-pentafluorophenyl group, 2,3,4-trifluorophenyl group, 2,4-difluorophenyl group, 4-fluorophenyl group and 4-undecanyloxy-2,3,5,6-tetrafluorophenyl group.

Examples of the fluorinated alkyl group-substituted aryl group of $Q_1$ and $Q_2$ include 3-trifluoromethylphenyl group, 3,5-bis(trifluoromethyl)phenyl group, 4-trifluoromethylphenyl group and 4-n-nonafluorobutylphenyl group.

Specific examples of the sulfonic acid generator are set forth below, but the present invention is not limited thereto.

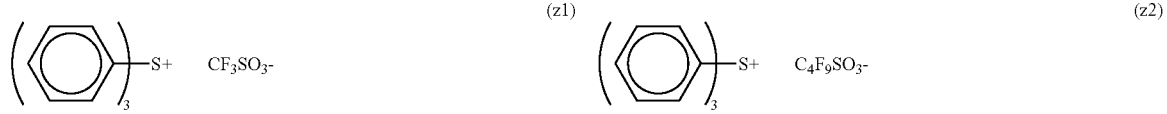

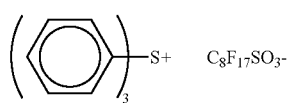 (z3)
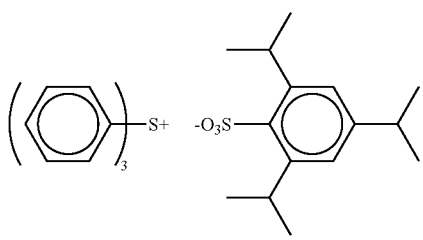 (z4)
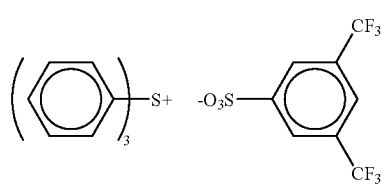 (z5)
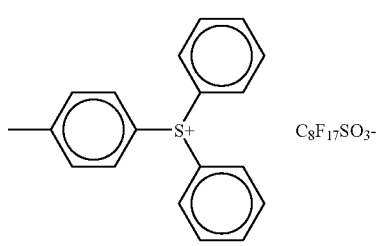 (z6)
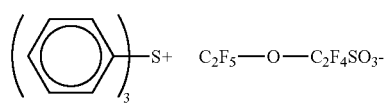 (z8)
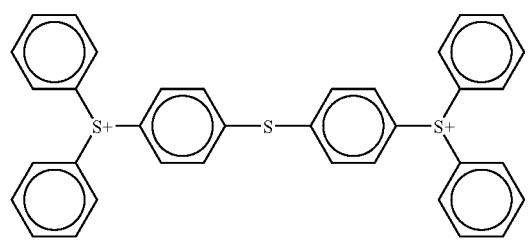 (z10)
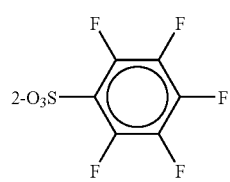
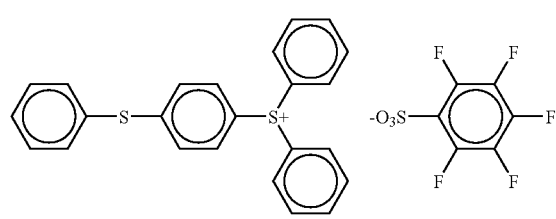 (z11)
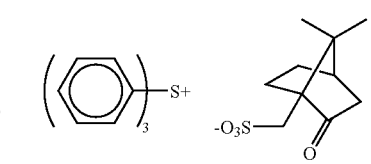 (z12)
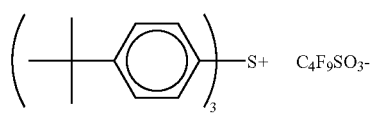 (z13)
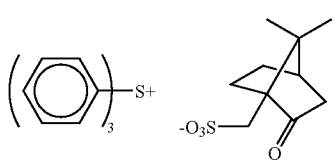 (z14)
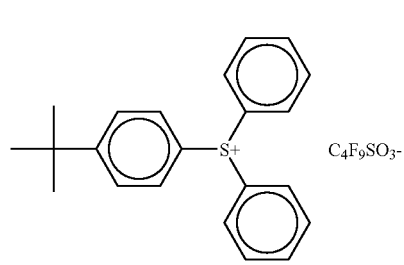 (z15)
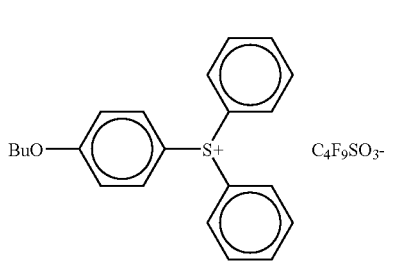 (z16)

-continued
(Z17)
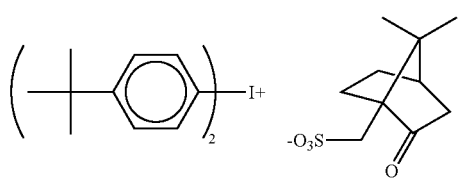
(z18)
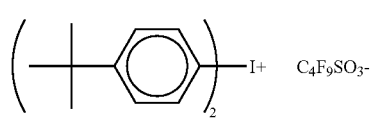
(z19)
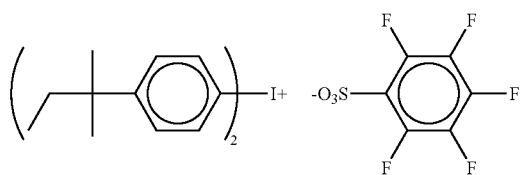
(z20)
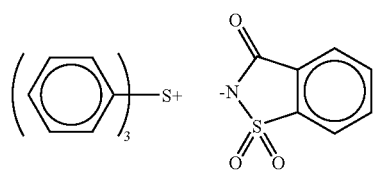
(z21)
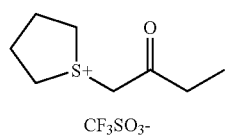
(z22)
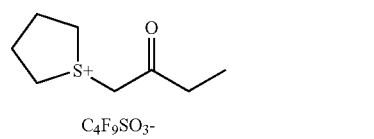
(z23)
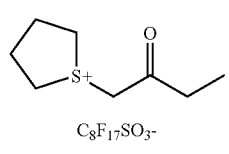
(z24)
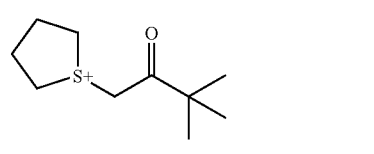
(z25)
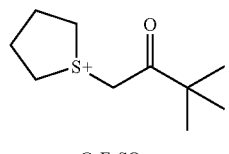
(z26)
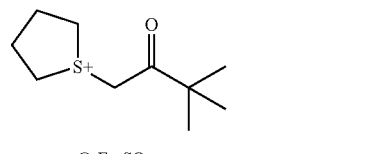
(z27)
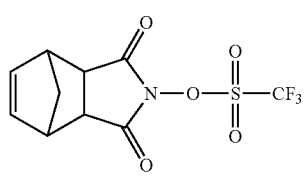
(z28)
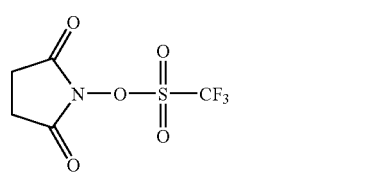
(z29)
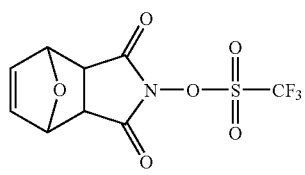
(z30)
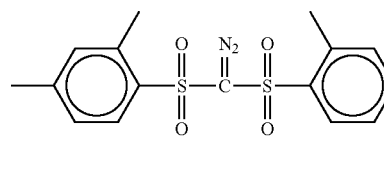
(z31)
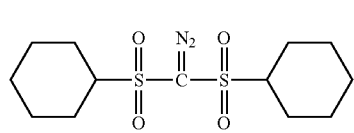
(z32)
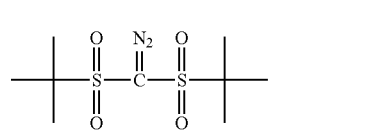
(z33)
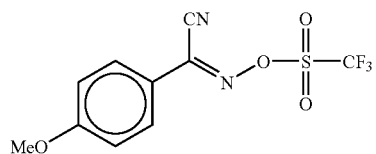

-continued
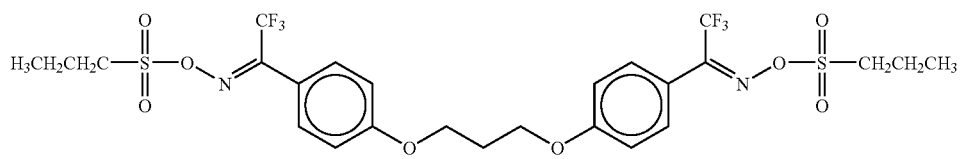
(z34)
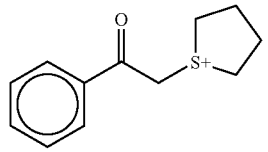
(z35)
CF₃SO₃⁻
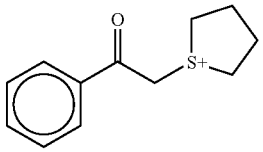
(z36)
C₄F₉SO₃⁻
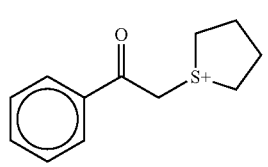
(z37)
C₈F₁₇SO₃⁻
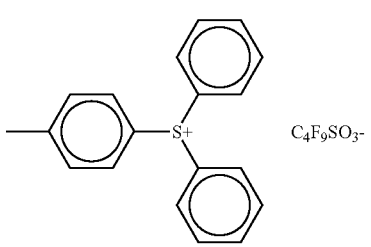
(z38)
C₄F₉SO₃⁻
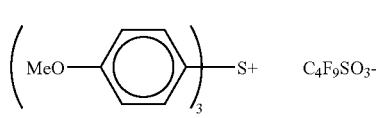
(z39)
C₄F₉SO₃⁻
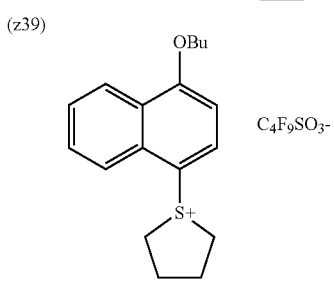
(z40)
C₄F₉SO₃⁻
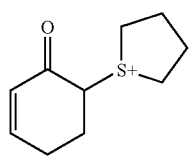
(z41)
C₄F₉SO₃⁻
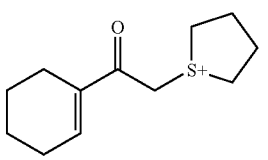
(z42)
C₄F₉SO₃⁻
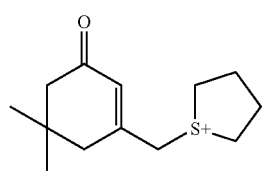
(z43)
C₄F₉SO₃⁻
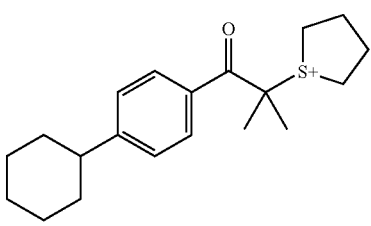
(z44)
C₄F₉SO₃⁻
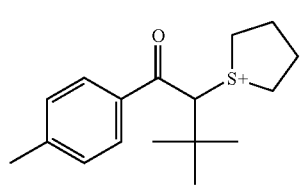
(z45)
C₄F₉SO₃⁻
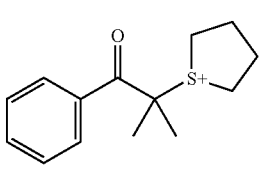
(z46)
C₄F₉SO₃⁻

-continued
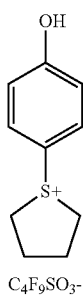 (z47)
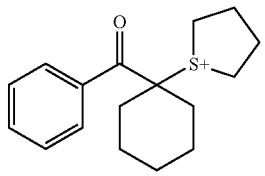 (z48)
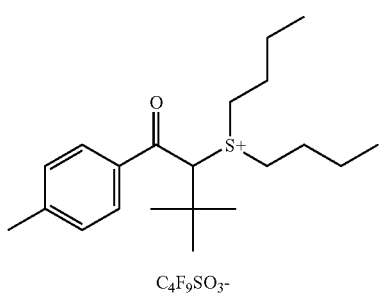 (z49)
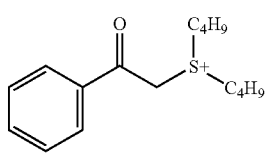 (z50)
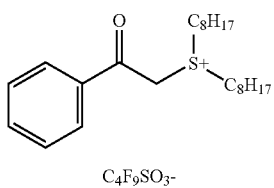 (z51)
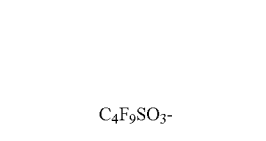 (z52)
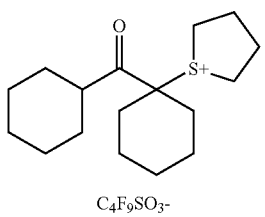 (z53)
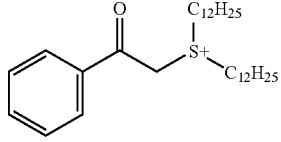 (z54)
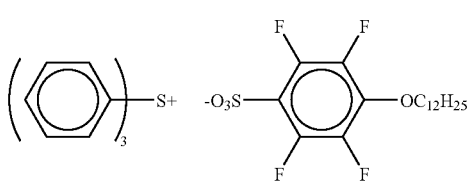 (z55)
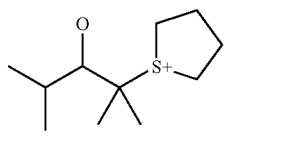 (z56)
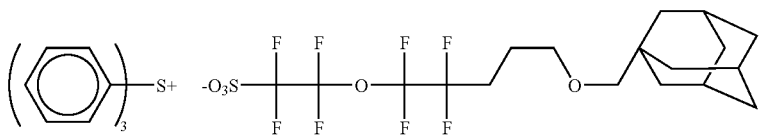 (z57)
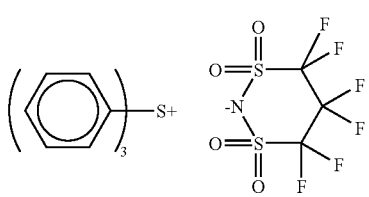 (z58)
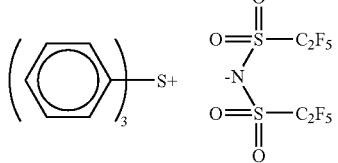 (z59)

The content of the sulfonic acid generator is from 0.01 to 30 mass %, preferably from 0.3 to 20 mass %, more preferably from 0.5 to 10 mass %, based on the solid content of the positive resist composition.

The sulfonic acid generator can be synthesized by a known method such as synthesis method described in JP-A-2002-27806.

In the positive resist composition of the present invention, a compound capable of generating a carboxylic acid upon irradiation with actinic rays or radiation (hereinafter, sometimes referred to as a "carboxylic acid generator") may be used together with the sulfonic acid generator.

The carboxylic acid generator is preferably a compound represented by the following formula (C):

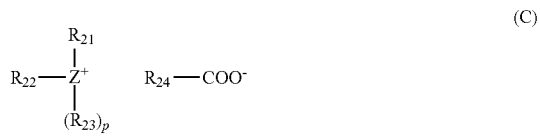

In formula (C), $R_{21}$ to $R_{23}$ each independently represents an alkyl group, a cycloalkyl group, an alkenyl group or an aryl group.

$R_{24}$ represents a hydrogen atom, an alkyl group, a cycloalkyl group, an alkenyl group or an aryl group.

Z represents a sulfur atom or an iodine atom. p is 1 when Z is a sulfur atom, and p is 0 when Z is an iodine atom.

In formula (C), $R_{21}$ to $R_{23}$ each independently represents an alkyl group, a cycloalkyl group, an alkenyl group or an aryl group, and these groups each may have a substituent.

Examples of the substituent which the alkyl group, cycloalkyl group and alkenyl group each may have include a halogen atom (e.g., chlorine, bromine, fluorine), an aryl group (e.g., phenyl, naphthyl), a hydroxy group and an alkoxy group (e.g., methoxy, ethoxy, butoxy).

Examples of the substituent which the aryl group may have include a halogen atom (e.g., chlorine, bromine, fluorine), a nitro group, a cyano group, an alkyl group (e.g., methyl, ethyl, tert-butyl, tert-amyl, octyl), a hydroxy group and an alkoxy group (e.g., methoxy, ethoxy, butoxy).

$R_{21}$ to $R_{23}$ each is, independently, preferably an alkyl group having a carbon number of 1 to 12, a cycloalkyl group having a carbon number of 3 to 12, an alkenyl group having a carbon number of 2 to 12 or an aryl group having a carbon number of 6 to 24, more preferably an alkyl group having a carbon number of 1 to 6, a cycloalkyl group having a carbon number of 3 to 6 or an aryl group having a carbon number of 6 to 18, still more preferably an aryl group having a carbon number of 6 to 15, and these groups each may have a substituent.

$R_{24}$ represents a hydrogen atom, an alkyl group, a cycloalkyl group, an alkenyl group or an aryl group.

Examples of the substituent which the alkyl group, cycloalkyl group and alkenyl group each may have are the same as those of the substituent described above when $R_{21}$ is an alkyl group. Examples of the substituent for the aryl group are the same as those of the substituent described above when $R_{21}$ is an aryl group.

$R_{24}$ is preferably a hydrogen atom, an alkyl group having a carbon number of 1 to 30, a cycloalkyl group having a carbon number of 3 to 30, an alkenyl group having a carbon number of 2 to 30 or an aryl group having a carbon number of 6 to 24, more preferably an alkyl group having a carbon number of 1 to 18, a cycloalkyl group having a carbon number of 3 to 18 or an aryl group having a carbon number of 6 to 18, still more preferably an alkyl group having a carbon number of 1 to 12, a cycloalkyl group having a carbon number of 3 to 12 or an aryl group having a carbon number of 6 to 15. These groups each may have a substituent.

Z represents a sulfur atom or an iodine atom. p is 1 when Z is a sulfur atom, and 0 when Z is an iodine atom.

Incidentally, two or more cation moieties of formula (C) may combine through a single bond or a linking group (e.g., —S—, —O—) to form a cation structure having a plurality of cation moieties of formula (C).

Specific preferred examples of the compound capable of generating a carboxylic acid upon irradiation with actinic rays or radiation are set forth below, but the present invention is of course not limited thereto.

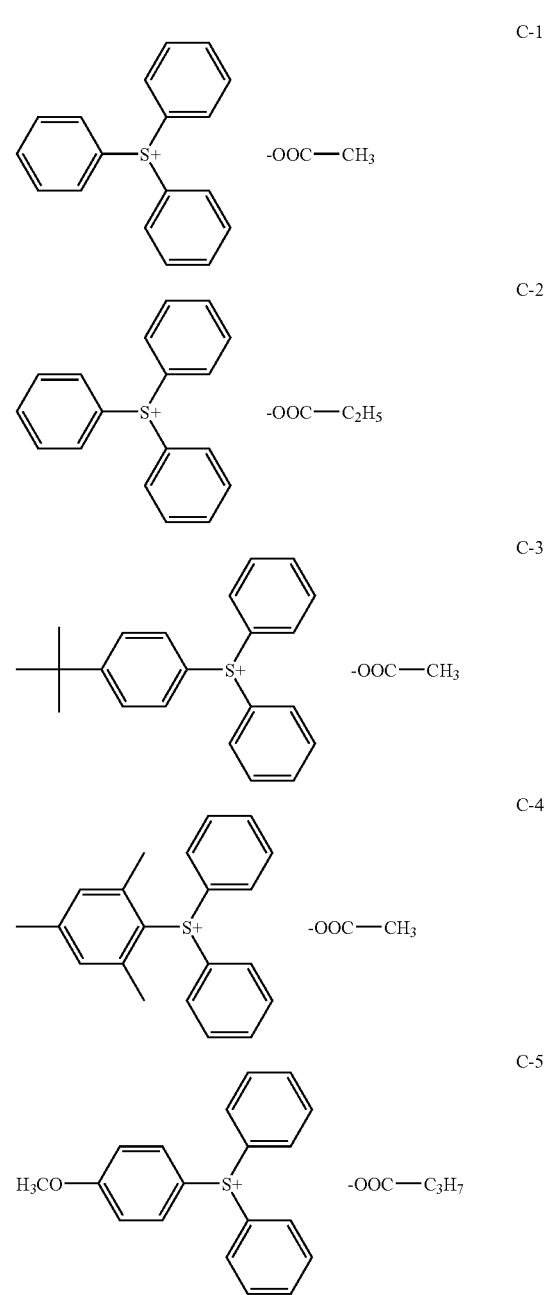

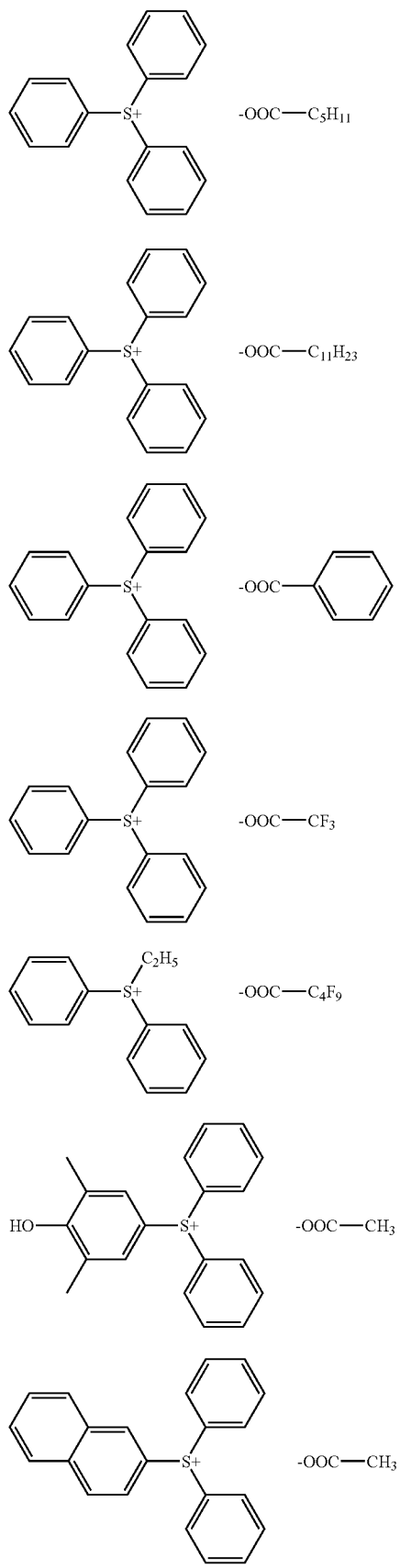
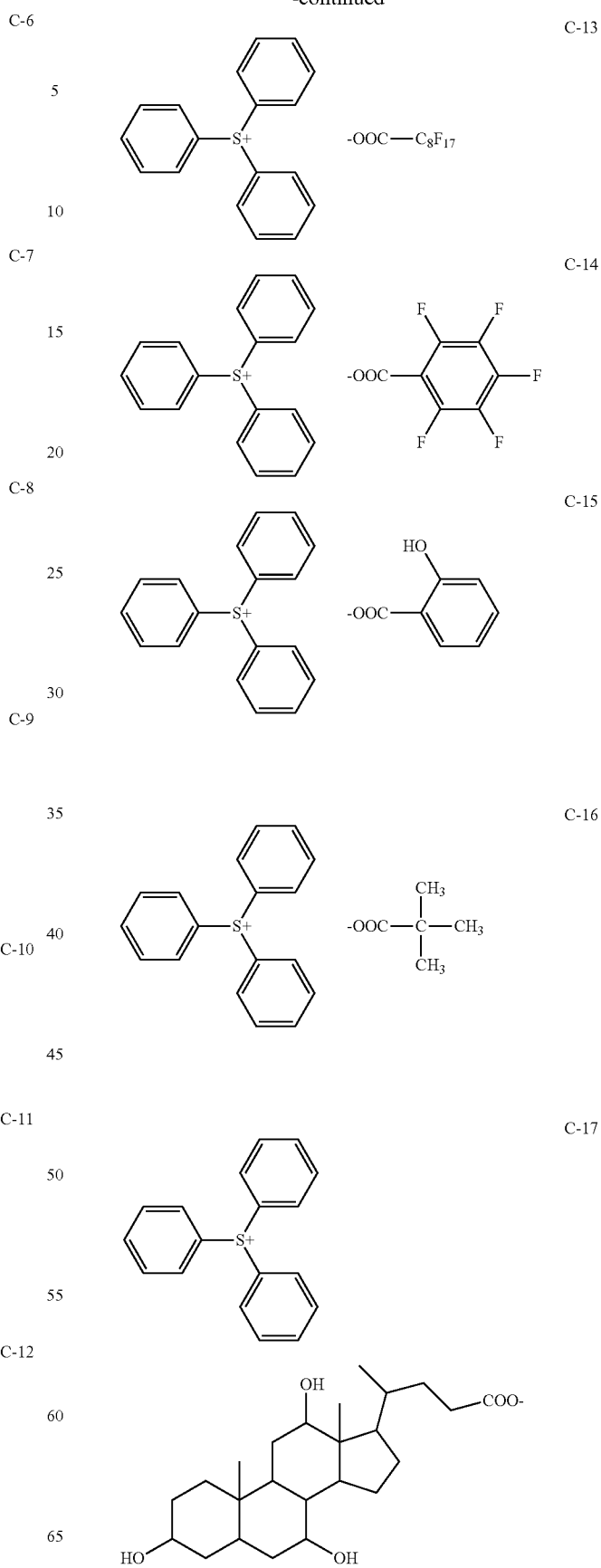

-continued

C-18
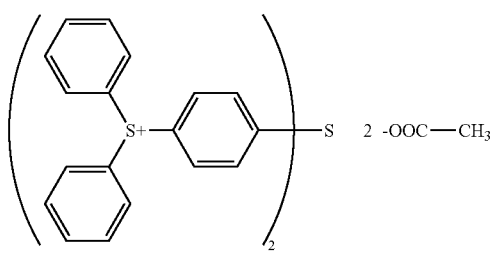

C-19
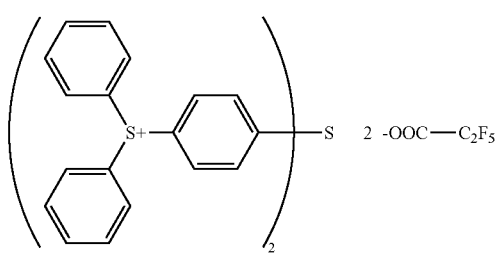

C-20
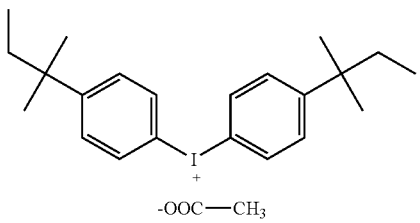

C-21
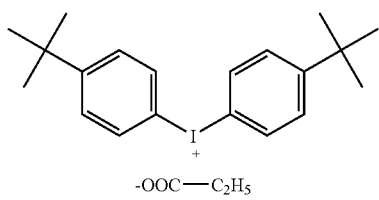

C-22
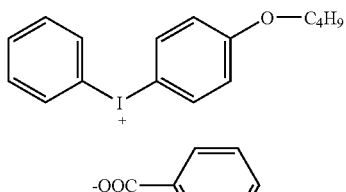

C-23
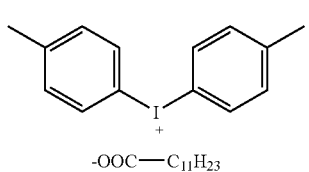

C-24
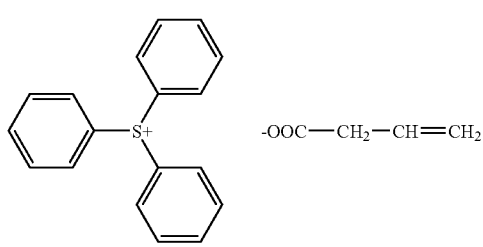

-continued

C-25
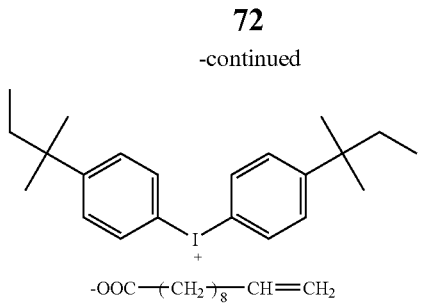

The content of the carboxylic acid generator in the positive resist composition of the present invention is preferably from 0.01 to 10 mass %, more preferably from 0.03 to 5 mass %, still more preferably from 0.05 to 3 mass %, based on the entire solid content of the composition. One of these compounds capable of generating a carboxylic acid upon irradiation with actinic rays or radiation may be used, or two or more kinds thereof may be mixed and used.

The carboxylic acid generator/sulfonic acid generator (ratio by mass) is usually from 99.9/0.1 to 50/50, preferably from 99/1 to 60/40, more preferably from 98/2 to 70/30.

The carboxylic acid generator can be synthesized by a known method such as synthesis method described in JP-A-2002-27806.

Organic Basic Compound:

In the present invention, an organic basic compound is preferably used, for example, from the standpoint of enhancing the performance such as resolving power or the storage stability. The organic basic compound is more preferably a compound containing a nitrogen atom (nitrogen-containing basic compound).

The organic basic compound preferred in the present invention is a compound having basicity stronger than that of phenol.

The preferred chemical environment thereof includes structures of the following formulae (A) to (E). The structures of formulae (B) to (E) each may be a part of a ring structure.

$$R^{200}-\underset{\underset{R^{201}}{|}}{N}-R^{202} \quad (A)$$

$$-\underset{|}{N}-\underset{|}{C}=N- \quad (B)$$

$$=\underset{|}{C}-N=\underset{|}{C}- \quad (C)$$

$$=\underset{|}{C}-N- \quad (D)$$

$$R^{203}-\underset{\underset{}{|}}{\overset{R^{204}}{C}}-N-\underset{\underset{}{|}}{\overset{R^{205}}{C}}-R^{206} \quad (E)$$

In formula (A), $R^{200}$, $R^{201}$ and $R^{202}$, which may be the same or different, each represents a hydrogen atom, an alkyl group having a carbon number of 1 to 20, a cycloalkyl group having a carbon number of 3 to 20, or an aryl group having a carbon number of 6 to 20. Here, $R^{201}$ and $R^{202}$ may combine with each other to form a ring.

The alkyl group, cycloalkyl group and aryl group as $R^{200}$, $R^{201}$ and $R^{202}$ each may have a substituent. The alkyl group or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

In formula (E), $R^{203}$, $R^{204}$, $R^{205}$ and $R^{206}$, which may be the same or different, each represents an alkyl group or cycloalkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen-containing ring structure, or a compound having an alkylamino group.

Specific preferred examples thereof include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. Preferred examples of the substituent which these compounds each may have include an amino group, an alkylamino group, an aminoaryl group, an arylamino group, an alkyl group (as the substituted alkyl group, particularly an aminoalkyl group), an alkoxy group, an acyl group, an acyloxy group, an aryl group, an aryloxy group, a nitro group, a hydroxyl group and a cyano group.

More preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

One of these nitrogen-containing basic compounds may be used alone, or two or more kinds thereof may be used in combination.

A tetraalkylammonium salt-type nitrogen-containing basic compound may also be used. Among such compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred.

One of these nitrogen-containing basic compounds may be used alone, or two or more kinds thereof may be used in combination.

As for the ratio between the acid generator and the organic basic compound used in the composition, the (total amount of acid generator)/(organic basic compound) (ratio by mol) is preferably from 2.5 to 300. When this molar ratio is 2.5 or more, high sensitivity is obtained, and when the molar ratio is 300 or less, the resist pattern can be prevented from thickening in aging after exposure until heat treatment and the resolving power can be enhanced. The (total amount of acid generator)/(organic basic compound) (ratio by mol) is more preferably from 5.0 to 200, still more preferably from 7.0 to 150.

Surfactants:

In the present invention, surfactants may be used and this is preferred in view of film-forming property, adhesion of pattern, reduction of development defects, and the like.

Specific examples of the surfactant include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing surfactant and a silicon-containing surfactant, such as EFtop EF301, EF303 and EF352 (produced by Shin-Akita Chemical Co., Ltd.), Megafac F171 and F173 (produced by Dainippon Ink & Chemicals, Inc.), Florad FC430 and FC431 (produced by Sumitomo 3M Inc.), Asahiguard AG710, Surflon S-382, SC101, SC102, SC103, SC104, SC105 and SC106 (produced by Asahi Glass Co., Ltd.), and Troysol S-366 (produced by Troy Chemical Industries, Inc.); an organo-siloxane polymer, KP-341 (produced by Shin-Etsu Chemical Co., Ltd.); and acrylic acid-based or methacrylic acid-based (co)polymers Polyflow No. 75 and No. 95 (produced by Kyoeisha Yushi Kagaku Kogyo Co., Ltd.).

The amount of such a surfactant blended is usually 2 parts by mass or less, preferably 1 part by mass or less, per 100 parts by mass of the solid content in the composition of the present invention.

One of these surfactants may be used alone or several species thereof may be added in combination.

As for the surfactant, the composition preferably contains any one species of fluorine- and/or silicon-containing surfactants (a fluorine-containing surfactant, a silicon-containing surfactant or a surfactant containing both a fluorine atom and a silicon atom), or two or more species thereof.

Examples of these surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, a polysiloxane polymer KP-341 (produced by Shin-Etsu Chemical Co., Ltd.) may also be used as the silicon-containing surfactant.

Other than these known surfactants, a surfactant using a polymer having a fluoroaliphatic group derived from a fluoroaliphatic compound produced by a telomerization process (also called a telomer process) or an oligomerization process (also called an oligomer process) may be used. The fluoroaliphatic compound can be synthesized by the method described in JP-A-2002-90991.

The polymer having a fluoroaliphatic group is preferably a copolymer of a fluoroaliphatic group-containing monomer with a (poly(oxyalkylene))acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoroaliphatic group-containing monomer with a (poly(oxyalkylene))acrylate (or methacrylate) may be not only a binary copolymer but also a ternary or higher copolymer obtained by simultaneously copolymerizing two or more different fluoroaliphatic group-containing monomers or two or more different (poly(oxyalkylene))acrylates (or methacrylates).

Examples thereof include commercially available surfactants such as Megafac F178, F-470, F-473, F-475, F-476 and F-472 (produced by Dainippon Ink & Chemicals, Inc.), and further include a copolymer of a $C_6F_{13}$ group-containing acrylate (or methacrylate) with a (poly(oxyalkylene))acrylate (or methacrylate), a copolymer of a $C_6F_{13}$ group-containing acrylate (or methacrylate) with (poly(oxyethylene))acrylate (or methacrylate) and (poly(oxypropylene))acrylate (or methacrylate), a copolymer of a $C_8F_{17}$ group-containing acrylate (or methacrylate) with a (poly(oxyalkylene))acrylate (or methacrylate), and a copolymer of a $C_8F_{17}$ group-containing acrylate (or methacrylate) with (poly(oxyethylene))acrylate (or methacrylate) and (poly(oxypropylene))acrylate (or methacrylate).

The amount of the surfactant used is preferably from 0.0001 to 2 mass %, more preferably from 0.001 to 1 mass %, based on the entire amount of the positive resist composition (excluding the solvent).

Other Components:

The positive resist composition of the present invention may further contain, if desired, a dye, a photobase generator and the like.

1. Dye

In the present invention, a dye may be used.

The suitable dye includes an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photobase Generator

Examples of the photobase generator which can be added to the composition of the present invention include compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photobase generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. Such a photobase generator is added for the purpose of improving the resist profile or the like.

3. Solvents

The resist composition of the present invention after dissolving the components described above in a solvent is coated on a support. Usually, the concentration is, in terms of the solid content concentration of all resist components, preferably from 2 to 30 mass %, more preferably from 3 to 25 mass %.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents is used alone, or several species thereof are mixed and used.

The positive resist composition of the present invention is coated on a substrate to form a thin film. The thickness of this coated film is preferably from 0.05 to 4.0 μm.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon actinic rays or radiation such as KrF excimer laser light, electron beam or EUV light, and then subjecting the resist film to heating, development, rinsing and drying, whereby a good resist pattern can be formed.

The alkali developer which can be used in the development is an aqueous solution of alkalis (usually, 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline), and cyclic amines (e.g., pyrrole, piperidine). This aqueous solution of alkalis may be used after adding thereto alcohols such as isopropyl alcohol or a surfactant such as nonionic surfactant in an appropriate amount.

Among these developers, a quaternary ammonium salt is preferred, and tetramethylammonium hydroxide and choline are more preferred.

The pH of the alkali developer is usually from 10 to 15.

EXAMPLES

The present invention is described in greater detail below by referring to Examples, but the present invention should not be construed as being limited thereto.

Synthesis Example 1

Synthesis of Resin (R-101)

After dissolving 36 g of a (4-vinylphenol)-(4'-vinyl-trifluoromethylacetophenone oxime 2,4,6-triisoprpylbenzene sulfonate) copolymer (compositional ratio: 95/5, weight average molecular weight: 8,900) in 200 mL of THF, 6 g of ethyl vinyl ether and 0.05 g of p-toluenesulfonic acid were added to the reaction solution and allowed to react at room temperature for 3 hours. Thereto, 0.1 g of triethylamine was added and after stirring for 10 minutes, the reaction solution was reprecipitated in 2 L of distilled water. The precipitated white powder was collected by filtration and then dried at 40° C. under reduced pressure.

The compositional ratio of the polymer determined from $C^{13}$NMR was 65/30/5. Also, the weight average molecular weight determined by GPC was 9,200 in terms of standard polystyrene.

The other resins were synthesized in the same way.

The compositional ratio (molar ratio of repeating units, corresponding to repeating units from the left), weight average molecular weight and dispersity of the resin (A) used in Examples are shown in Table 1 below.

TABLE 1

| Resin | Compositional Ratio | Weight Average Molecular Weight | Dispersity |
|---|---|---|---|
| R-101 | 65/30/5 | 9200 | 1.7 |
| R-102 | 60/35/5 | 12000 | 1.7 |
| R-104 | 65/20/5/10 | 9700 | 1.6 |
| R-107 | 63/32/5 | 9600 | 1.9 |
| R-109 | 60/20/5/15 | 10500 | 1.7 |
| R-110 | 65/30/5 | 11500 | 1.7 |
| R-113 | 65/30/5 | 10900 | 1.9 |
| R-114 | 60/25/5/10 | 8900 | 1.6 |
| R-115 | 65/30/5 | 9800 | 1.7 |
| R-117 | 60/35/5 | 11300 | 1.7 |
| R-119 | 65/20/5/10 | 8500 | 1.7 |
| R-120 | 65/30/5 | 9300 | 1.6 |
| R-121 | 65/30/5 | 14200 | 1.7 |
| R-123 | 65/30/5 | 7900 | 1.6 |
| R-124 | 60/25/5/10 | 10700 | 1.7 |
| R-125 | 60/35/5 | 9400 | 1.6 |
| R-128 | 60/35/5 | 11500 | 1.7 |
| R-131 | 70/25/5 | 11500 | 1.7 |
| R-132 | 70/25/5 | 11500 | 1.7 |

Examples 1 to 21 and Comparative Example 1

The components shown in Table 2 were dissolved in 8.8 g of propylene glycol monomethyl ether acetate, and the obtained solution was microfiltered through a membrane filter having a pore size of 0.1 μm to obtain a resist solution.

A film, Antireflection Film DUV-42, produced by Nissan Chemical Industries, Ltd. was provided on a 6-inch silicon wafer by using a spin coater, Mark 8, manufactured by Tokyo Electron Ltd. and then baked at 200° C. for 60 seconds to obtain a film having an average thickness of 60 nm. Thereafter, the resist solution obtained above was coated on this film in the same manner and then baked at 110° C. for 90 seconds to obtain a uniform film of 0.35 μm.

The resist film formed was pattern-exposed using a KrF excimer laser stepper (FPA3000EX-5, manufactured by Canon Inc., wavelength: 248 nm), then baked at 110° C. for 90 seconds, dipped in an aqueous 2.38 mass % tetramethylammonium hydroxide (TMAH) solution for 60 seconds, rinsed with water for 30 seconds, and dried. The thus-obtained pattern was evaluated by the following methods (1) Sensitivity The cross-sectional profile of the pattern obtained was observed using a scanning electron microscope (S-4300, manufactured by Hitachi, Ltd.). The minimum irradiation energy for resolving a 0.18-μm line (line:space=1:1) was defined as the sensitivity.

(2) Resolving Power

The limiting resolving power (the line and the space were separated and resolved) with the irradiation dose giving the sensitivity above was defined as the resolving power.

(3) LWR (Line Width Roughness)

With respect to a resist pattern obtained in the same manner as above, the line width was observed by a scanning electron microscope (S-9220, manufactured by Hitachi, Ltd.) to inspect the line width fluctuation (LWR) for the line width of 180 nm. The line width was detected at 30 positions in the measuring monitor by using a length-measuring scanning electron microscope (SEM), and the dispersion (3σ) of variations of the line widths at the detected positions was taken as the indication of LWR.

(4) Exposure Margin

The exposure dose when reproducing a line in a mask size of 180 nm (360 nm pitch) was defined as the optimum exposure dose (E0) and assuming that the maximum exposure dose and the minimum exposure dose when reproducing a line width of ±10% are E1 and E2, respectively, the exposure margin (%) was determined according to the following formula.

|(E1−E2)/E0|×100

(5) Defocus Latitude Depended on Line Pitch

In a 0.18-μm line pattern at the irradiation dose giving the sensitivity above, the line width of a dense pattern (line: space=1:1) and the line width of an isolated pattern were measured. The difference therebetween was defined as the defocus latitude depended on line pitch.

The evaluation results are shown in Table 2.

TABLE 2

| | Resin | Acid Generator | Basic Compound (0.003 g) | Surfactant (0.001 g) | Sensitivity (mJ/cm$^2$) | Resolving Power (μm) | LWR (nm) | Exposure Margin (%) | Defocus Latitude Depended on Line Pitch (nm) |
|---|---|---|---|---|---|---|---|---|---|
| Example 1 | R-101 (0.98 g) | none | D-1 | W-1 | 28 | 0.15 | 8.6 | 12 | 11 |
| Example 2 | R-104 (0.98 g) | none | D-2 | W-1 | 29 | 0.15 | 8.9 | 13 | 12 |
| Example 3 | R-110 (0.98 g) | C-1 (0.02 g) | D-3 | W-2 | 27 | 0.14 | 7.6 | 12 | 11 |
| Example 4 | R-102 (0.98 g) | none | D-1 | W-1 | 29 | 0.16 | 8.4 | 13 | 11 |
| Example 5 | R-107 (0.98 g) | none | D-2 | W-1 | 30 | 0.15 | 9.5 | 13 | 12 |
| Example 6 | R-109 (0.98 g) | none | D-1 | W-2 | 28 | 0.16 | 8.8 | 14 | 13 |
| Example 7 | R-110 (0.98 g) | none | D-1 | W-1 | 27 | 0.15 | 8.5 | 13 | 11 |
| Example 8 | R-121 (0.98 g) | z3 (0.02 g) | D-2 | W-1 | 24 | 0.16 | 9.0 | 12 | 12 |
| Example 9 | R-123 (0.98 g) | z4 (0.02 g) | D-1 | W-2 | 25 | 0.16 | 8.8 | 14 | 11 |
| Example 10 | R-124 (0.98 g) | z12 (0.02 g) | D-1 | W-1 | 25 | 0.16 | 8.5 | 13 | 12 |
| Example 11 | R-125 (0.98 g) | C-8 (0.02 g) | D-1 | W-1 | 29 | 0.14 | 7.4 | 12 | 11 |
| Example 12 | R-128 (0.98 g) | z20 (0.02 g) | D-1 | W-2 | 28 | 0.16 | 8.5 | 14 | 13 |
| Example 13 | R-114 (0.98 g) | z32 (0.02 g) | D-2 | W-1 | 24 | 0.16 | 9.5 | 14 | 12 |
| Example 14 | R-117 (0.98 g) | z34 (0.02 g) | D-1 | W-1 | 25 | 0.17 | 8.8 | 13 | 11 |
| Example 15 | R-119 (0.98 g) | z51 (0.02 g) | D-1 | W-2 | 25 | 0.16 | 9.5 | 14 | 12 |

TABLE 2-continued

| | Resin | Acid Generator | Basic Compound (0.003 g) | Surfactant (0.001 g) | Sensitivity (mJ/cm$^2$) | Resolving Power (μm) | LWR (nm) | Exposure Margin (%) | Defocus Latitude Depended on Line Pitch (nm) |
|---|---|---|---|---|---|---|---|---|---|
| Example 16 | R-120 (0.98 g) | none | D-1 | W-2 | 29 | 0.17 | 8.8 | 14 | 11 |
| Example 17 | R-113 (0.95 g) | z2 (0.02 g) | D-1 | W-1 | 24 | 0.15 | 8.6 | 12 | 13 |
| Example 18 | R-115 (0.95 g) | z18 (0.02 g) | D-2 | W-1 | 24 | 0.16 | 8.9 | 13 | 11 |
| Example 19 | R-119 (0.95 g) | z31 (0.02 g) | D-2 | W-1 | 24 | 0.16 | 8.9 | 13 | 11 |
| Example 20 | R-131 (0.98 g) | none | D-1 | W-1 | 22 | 0.14 | 7.6 | 14 | 12 |
| Example 21 | R-132 (0.98 g) | none | D-1 | W-1 | 22 | 0.13 | 7.5 | 13 | 12 |
| Comparative Example 1 | CP-1 (0.93 g) | z2 (0.02 g) | D-1 | W-1 | 36 | 0.18 | 11.5 | 7 | 15 |

Abbreviations in the Table are as follows.
[Basic Compound]
D-1: tri-n-hexylamine
D-2: 2,4,6-triphenylimidazole
D-3: tetra-(n-butyl)ammonium hydroxide
[Surfactant]
W-1: fluorine-containing surfactant, Megafac F-176 (produced by Dainippon Ink & Chemicals, Inc.)
W-2: fluorine/silicon-containing surfactant, Megafac R08 (produced by Dainippon Ink & Chemicals, Inc.)

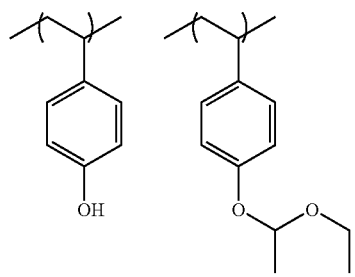

CP-1
(68/32)
Weight average molecular weight: 9,700

It is seen from Table 2 that as regards the pattern formation by the irradiation with a KrF excimer laser, the positive resist composition of the present invention exhibits high sensitivity and high resolving power and is excellent in terms of LWR, defocus latitude depended on line pitch and exposure margin.

Incidentally, the positive resist composition of the present invention formed a good pattern also by the irradiation with electron beam, X ray or EUV.

According to the present invention, a positive resist composition suitably usable for irradiation with actinic rays or radiation, particularly, KrF excimer laser light, electron beam, X ray or EUV light, and capable of satisfying all performances in terms of high sensitivity, high resolution, good defocus latitude depended on line pitch, line width roughness and exposure margin, and a pattern forming method using the composition can be provided.

The entire disclosure of each and every foreign patent application from which the benefit of foreign priority has been claimed in the present application is incorporated herein by reference, as if fully set forth.

What is claimed is:
1. A positive resist composition, comprising:
(A) a resin having a repeating unit represented by formula (A), which decomposes under an action of an acid to increase a solubility of the resin (A) in an alkali developer:

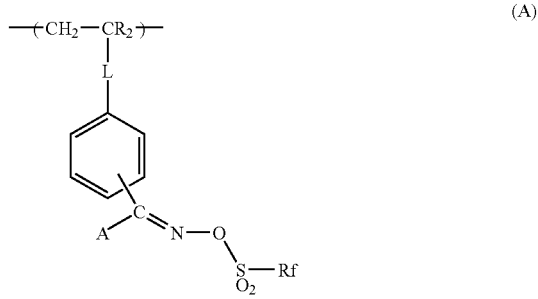

wherein $R_2$ represents a hydrogen atom, an alkyl group, a cyano group or a halogen atom;
L represents a single bond or a divalent linking group;
A represents a monovalent organic group;
Rf represents an alkyl group, a cycloalkyl group or an aryl group; and
each of the alkyl group, cycloalkyl group and aryl group represented by Rf is unsubstituted or has an alkyl group, a cycloalkyl group, or a halogen atom as a substituent.

2. The positive resist composition according to claim 1, wherein in formula (A), A is an alkyl, cycloalkyl or aryl group substituted by a group selected from the group consisting of a halogen atom, a cyano group and a nitro group.

3. The positive resist composition according to claim 1, wherein in formula (A), Rf is an alkyl or aryl group substituted by a halogen atom.

4. The positive resist composition according to claim 1, wherein $R_2$ represents a hydrogen atom or a methyl group.

5. The positive resist composition according to claim 1, wherein L represents a single bond, an arylene group, an ester group or an amido group.

6. The positive resist composition according to claim 1, which further comprises (B) a compound capable of generating an acid upon irradiation with actinic rays or radiation.

7. A pattern forming method, comprising:
forming a resist film from the positive resist composition according to claim 1; and
exposing and developing the resist film.

8. The positive resist composition according to claim 6, wherein the compound capable of generating an acid upon irradiation with actinic rays or radiation (B) is a compound capable of generating a sulfonic acid upon irradiation with actinic rays or radiation and is a diazonium salt, a phosphonium salt, a sulfonium salt, an iodonium salt, an imidosulfonate, an oxime sulfonate, a diazodisulfone, a disulfone or an o-nitrobenzyl sulfonate.

9. The positive resist composition according to claim 6, wherein the compound capable of generating an acid upon irradiation with actinic rays or radiation (B) is a compound capable of generating a sulfonic acid upon irradiation with actinic rays or radiation and is a sulfonium salt, an iodonium salt, an imidosulfonate, an oxime sulfonate, a diazodisulfone or a disulfone.

10. The positive resist composition according to claim 6, wherein the compound capable of generating an acid upon irradiation with actinic rays or radiation (B) is a compound capable of generating a sulfonic acid upon irradiation with actinic rays or radiation and is represented by formula (ZI), (ZII) or (ZIII):

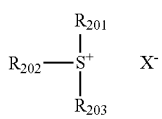

(ZI)

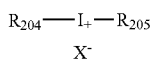

(ZII)

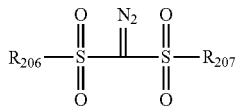

(ZIII)

wherein $R_{201}$, $R_{202}$ and $R_{203}$ each independently represents an organic group; two members out of $R_{201}$ to $R_{203}$ may combine to form a ring structure; $X^-$ represents an organic sulfonate anion; and $R_{204}$ to $R_{207}$ each independently represents an aryl group, an alkyl group or a cycloalkyl group.

11. A positive resist composition, comprising:

(A) a resin having a repeating unit represented by formula (A), which decomposes under an action of an acid to increase a solubility of the resin (A) in an alkali developer:

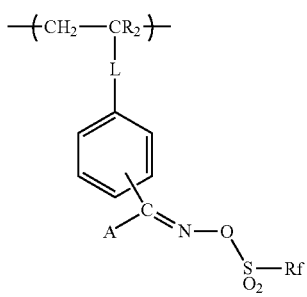

(A)

wherein $R_2$ represents a hydrogen atom, an alkyl group, a cyano group or a halogen atom;

L represents a single bond or a divalent linking group;

A represents a monovalent organic group; and

Rf represents an alkyl or aryl group substituted by a halogen atom, wherein the resin (A) further contains at least one of a repeating unit represented by formula (1) and a repeating unit represented by formula (2):

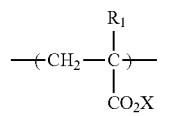

(1)

(2)

wherein in formula (1), $R_1$ represents a hydrogen atom, an alkyl group, a cyano group or a halogen atom; and X represents a group which leaves under an action of an acid, and in formula (2), $R_2$ represents a hydrogen atom, an alkyl group, a cyano group or a halogen atom;

$R_3$ represents an alkyl group, a halogen atom, an aryl group, an alkoxy group, an alkoxycarbonyl group or an acyl group, and when a plurality of $R_3$'s are present, the plurality of $R_3$'s are the same or different;

n represents an integer of 0 to 4;

$A_l$ represents a hydrogen atom, a group which leaves under an action of an acid or a group having a group which decomposes under an action of an acid, and when a plurality of $A_1$'s are present, the plurality of $A_1$'s are the same or different; and m represents an integer of 1 to 5, provided that $m+n \leq 5$.

12. The positive resist composition according to claim 11, wherein in formula (A), A is an alkyl, cycloalkyl or aryl group substituted by a group selected from the group consisting of a halogen atom, a cyano group and a nitro group.

13. The positive resist composition according to claim 11, which further comprises (B) a compound capable of generating an acid upon irradiation with actinic rays or radiation.

14. A pattern forming method, comprising:

forming a resist film from the positive resist composition according to claim 11; and exposing and developing the resist film.

15. A positive resist composition, comprising:

(A) a resin having a repeating unit represented by formula (A), which decomposes under an action of an acid to increase a solubility of the resin (A) in an alkali developer; and (B) a compound capable of generating a sulfonic acid upon irradiation with actinic rays or radiation which is a diazonium salt, a phosphonium salt, a sulfonium salt, an iodonium salt, an imidosulfonate, an oxime sulfonate, a diazodisulfone, a disulfone or an o-nitrobenzyl sulfonate;

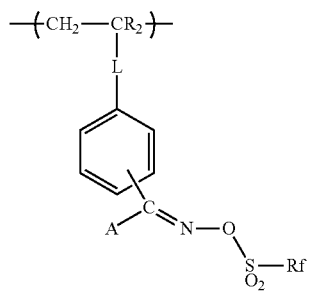

(A)

wherein $R_2$ represents a hydrogen atom, an alkyl group, a cyano group or a halogen atom;

L represents a single bond or a divalent linking group;

A represents a monovalent organic group;

Rf represents an alkyl group, a cycloalkyl group or an aryl group; and each of the alkyl group, cycloalkyl group and aryl group represented by Rf may have an alkyl group, a cycloalkyl group, a halogen atom, an alkoxy group, a hydroxyl group, an amido group, an ester group, a cyano group, a nitro group or a sulfide group as a substituent.

* * * * *